(12) United States Patent
Nakayama et al.

(10) Patent No.: US 9,536,978 B2
(45) Date of Patent: Jan. 3, 2017

(54) SEMICONDUCTOR DEVICE

(71) Applicant: Renesas Electronics Corporation, Kawasaki-shi (JP)

(72) Inventors: Tatsuo Nakayama, Kawasaki (JP); Hironobu Miyamoto, Kawasaki (JP); Yasuhiro Okamoto, Kawasaki (JP); Ryohei Nega, Kawasaki (JP); Masaaki Kanazawa, Kawasaki (JP); Takashi Inoue, Kawasaki (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 14/198,430

(22) Filed: Mar. 5, 2014

(65) Prior Publication Data

US 2014/0264274 A1    Sep. 18, 2014

(30) Foreign Application Priority Data

Mar. 13, 2013 (JP) ................................ 2013-051047

(51) Int. Cl.
*H01L 29/778* (2006.01)
*H01L 29/66* (2006.01)
(Continued)

(52) U.S. Cl.
CPC ....... *H01L 29/66462* (2013.01); *H01L 29/155* (2013.01); *H01L 29/7787* (2013.01); *H01L 29/2003* (2013.01)

(58) Field of Classification Search
CPC ............... H01L 29/155; H01L 29/2003; H01L 29/66462; H01L 29/7787

See application file for complete search history.

(56) References Cited

U.S. PATENT DOCUMENTS 7,329,908 B2   2/2008  Yoshida
8,787,418 B2 * 7/2014  Shur ...................... H01L 33/06
                                                    372/45.012
(Continued)

FOREIGN PATENT DOCUMENTS

JP   2001-274096    * 10/2001
JP   2003-031909 A    1/2003
(Continued)

OTHER PUBLICATIONS

Japanese Office Action dated Jul. 5, 2016, with an English translation.

*Primary Examiner* — A. Sefer
*Assistant Examiner* — Benjamin Tzu-Hung Liu
(74) *Attorney, Agent, or Firm* — McGinn IP Law Group, PLLC

(57) ABSTRACT

To improve performance of a semiconductor device. For example, on the assumption that a superlattice layer is inserted between a buffer layer and a channel layer, a concentration of acceptors introduced into nitride semiconductor layers forming a part of the superlattice layer is higher than a concentration of acceptors introduced into nitride semiconductor layers forming the other part of the superlattice layer. That is, the concentration of acceptors introduced into the nitride semiconductor layers having a small band gap is higher than the concentration of acceptors introduced into the nitride semiconductor layers having a large band gap.

18 Claims, 15 Drawing Sheets

(51) Int. Cl.
*H01L 29/15* (2006.01)
*H01L 29/20* (2006.01)

(56) References Cited

U.S. PATENT DOCUMENTS

| | | | |
|---|---|---|---|
| 9,269,799 B2 | 2/2016 | Ishiguro et al. | |
| 2004/0056259 A1* | 3/2004 | Goto | B82Y 20/00 |
| | | | 257/79 |
| 2005/0051804 A1* | 3/2005 | Yoshida | H01L 29/155 |
| | | | 257/213 |
| 2012/0326209 A1* | 12/2012 | Ooshika | H01L 21/02389 |
| | | | 257/183 |
| 2013/0256683 A1* | 10/2013 | Imanishi | H01L 29/778 |
| | | | 257/76 |
| 2013/0313560 A1* | 11/2013 | Khalil | H01L 29/402 |
| | | | 257/76 |

FOREIGN PATENT DOCUMENTS

| | | | | |
|---|---|---|---|---|
| JP | 003960957 | * | 8/2007 | H01L 29/155 |
| JP | 3960957 B2 | | 8/2007 | |
| JP | 2010-171032 A | | 8/2010 | |
| JP | 2011-205082 A | | 10/2011 | |
| JP | 2014-072429 A | | 4/2014 | |

* cited by examiner

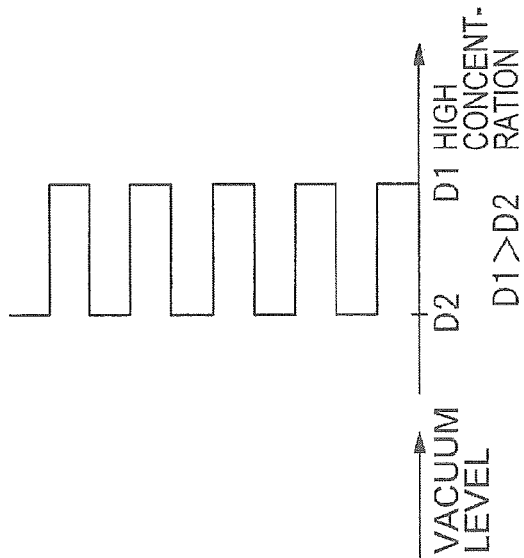
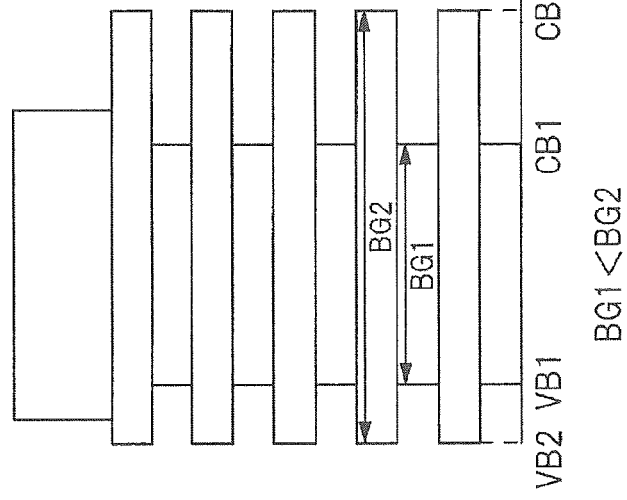
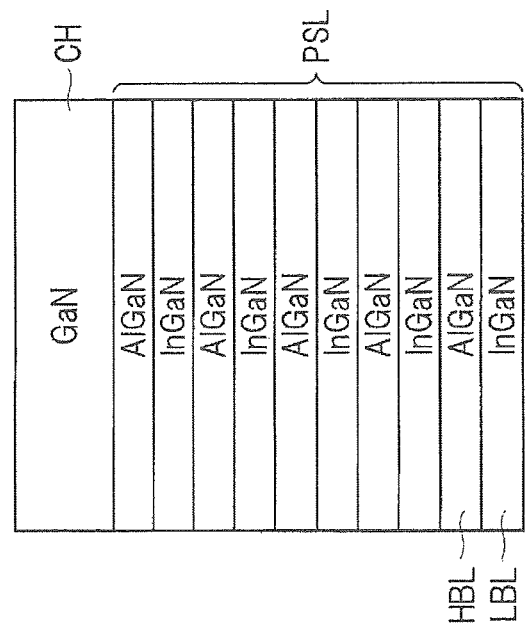

SEMICONDUCTOR DEVICE

CROSS-REFERENCE TO RELATED APPLICATION

The disclosure of Japanese Patent Application No. 2013-051047 filed on Mar. 13, 2013 including the specification, drawings and abstract is incorporated herein by reference in its entirety.

BACKGROUND

The present invention relates to a semiconductor device, for example, relates to an effective technique to be applied to a semiconductor device using nitride semiconductor layers.

Japanese Patent No. 3960957 (Patent Document 1) describes a technique for forming a buffer layer from a laminated structure of a first layer formed of a GaN layer that is a nitride semiconductor layer and a second layer formed of an AlGaN layer that is a nitride semiconductor layer and having a band larger than that of the first layer. In this technique, magnesium (Mg) that is an acceptor is introduced into both the first layer and the second layer and the addition amount of the magnesium introduced into the first layer and the addition amount of the magnesium introduced into the second layer are the same.

SUMMARY

For example, in a semiconductor manufacturing technique, by introducing conductive impurities into a semiconductor layer, an n-type semiconductor layer in which electrons are majority carriers and a p-type semiconductor layer in which positive holes are majority carriers are formed. Specifically, for example, while the n-type semiconductor layer is formed by addition of electron donors (n-type impurities) to the semiconductor layer, the p-type semiconductor layer is formed by addition of electron acceptors that accept electrons (p-type impurities) to the semiconductor layer.

Therefore, in a nitride semiconductor layer which is a type of semiconductor layer, the n-type semiconductor layer is formed by introducing donors represented by, for example, silicon (Si), and the p-type semiconductor layer is formed by introducing acceptors represented by, for example, magnesium (Mg).

Here, actually, it is possible to cause the semiconductor layer to function as the n-type semiconductor layer and the p-type semiconductor layer not only by addition of conductive impurities to the semiconductor layer, but also by, for example, performing heat treatment after addition of the conductive impurities to the semiconductor layer, to thereby activate the added conductive impurities.

However, the nitride semiconductor layer has characteristics in which the activation rate of the added acceptors is low, in particular, when forming the p-type semiconductor layer. It is known that the acceptors having not been activated forma so-called deep level in the nitride semiconductor layer, and as a result, there is a risk that performance degradation, due to the deep level, of the semiconductor device is caused. Therefore, in particular in the nitride semiconductor layer, there is desired improvement of the activation rate of the acceptors and improvement of the performance of the semiconductor device.

The other problems and the new feature will become clear from the description of the present specification and the accompanying drawings.

A semiconductor device according to an embodiment includes a superlattice layer formed by a laminated structure of a first nitride semiconductor layer and a second nitride semiconductor layer having a band gap larger than that of the first nitride semiconductor layer. At this time, a concentration of conductive impurities introduced into the first nitride semiconductor layer is larger than a concentration of conductive impurities introduced into the second nitride semiconductor layer.

According to the semiconductor device of an embodiment, it is possible to enhance the performance of the semiconductor device.

BRIEF DESCRIPTION OF THE DRAWINGS

FIG. 4A is a diagram showing a schematic configuration of a superlattice layer; FIG. 4B is a diagram showing a band gap of each layer including the superlattice layer; FIG. 4C is a diagram showing the concentration of acceptors introduced into each layer of the superlattice layer;

DETAILED DESCRIPTION

The following embodiments will be explained, divided into plural sections or embodiments, if necessary for convenience. Except for the case where it shows clearly in particular, they are not mutually unrelated and one has relationships such as a modification, details, and supplementary explanation of some or entire of another.

In the following embodiments, when referring to the number of elements or the like (including the number, a numeric value, an amount, a range, etc.), they may be not restricted to the specific number but may be greater or smaller than the specific number, except for the case where they are clearly specified in particular and where they are clearly restricted to a specific number theoretically.

Furthermore, in the following embodiments, it is needless to say that an element (including an element step and the like) is not necessarily indispensable, except for the case where it is clearly specified in particular and where it is considered to be clearly indispensable from a theoretical point of view or the like.

Similarly, in the following embodiments, when shape, position relationship or the like of an element or the like is referred to, what resembles or is similar to the shape substantially shall be included, except for the case where it is clearly specified in particular and where it is considered to be clearly not right from a theoretical point of view. This statement also applies to the numeric value and range described above.

Further, in all the drawings for explaining embodiments, the same symbol is attached to the same member, as a principle, and the repeated explanation thereof is omitted. In order to make a drawing intelligible, hatching may be attached even if it is a plan view.

(First Embodiment)
<Description of Related Art>

Figure 1:
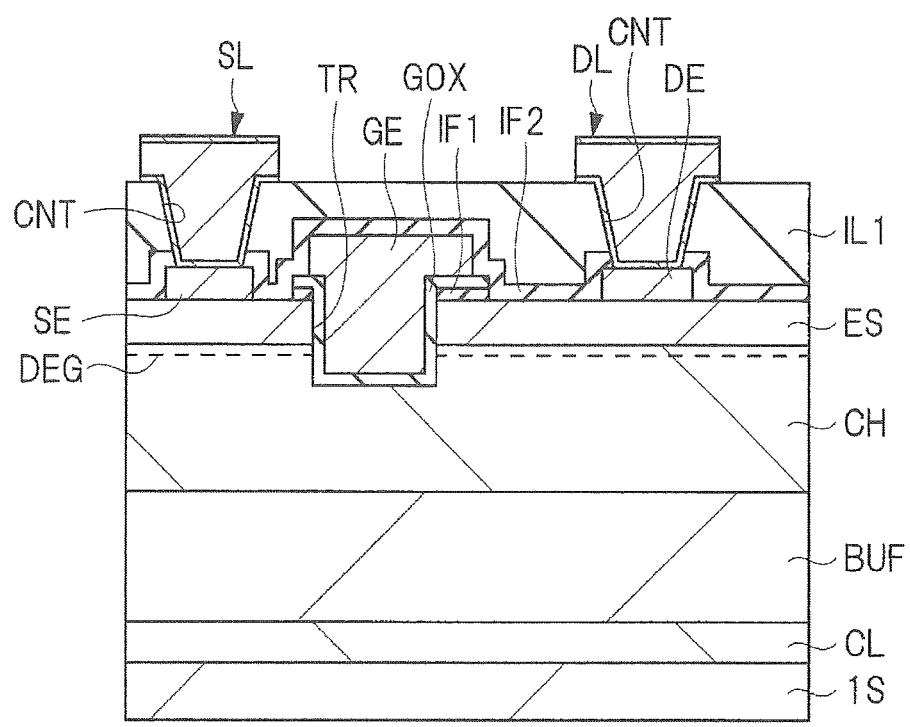
FIG. 1 is a cross-sectional view showing a configuration example of a semiconductor device according to a related art 1.

FIG. 1 is a cross-sectional view showing a configuration example of a semiconductor device according to a related art 1. In the related art 1, a power FET (Field Effect Transistor) including a high electron mobility transistor will be described as an example of the semiconductor device.

As shown in FIG. 1, in the power FET of the related art 1, a buffer layer BUF including, for example, an $Al_{0.07}Ga_{0.93}N$ layer is formed over a semiconductor substrate 1S including, for example, silicon, via a nucleation layer CL including, for example, an AlN layer (nitride aluminum layer). In addition, a high-electron-mobility layer (channel layer) CH including, for example, a GaN layer is formed over the buffer layer BUF and an electron supply layer ES including, for example, an AlGaN layer ($Al_{0.22}Ga_{0.78}N$) is formed over the channel layer CH.

Next, as shown in FIG. 1, in the power FET of the related art 1, there is formed an insulating film IF1 including, for example, a nitride silicon film on the surface of the electron supply layer ES, and there is formed a trench (groove) TR that reaches the channel layer CH from the surface of the electron supply layer ES extending across an interface between the electron supply layer ES and the channel layer CH. A gate insulating film GOX including, for example, a silicon oxide film ($SiO_2$ film) and an aluminum oxide film ($Al_2O_3$ film) is formed on the inner wall of the trench TR, and a gate electrode GE is buried inside the trench TR via the gate insulating film GOX.

Furthermore, as shown in FIG. 1, there are formed a source electrode SE and a drain electrode DE, which function as ohmic electrodes, over the electron supply layer ES, and there are formed an insulating film IF2 including, for example, a nitride silicon film and an interlayer insulating film IL1 including, for example, a silicon oxide film, so as to cover the source electrode SE and the drain electrode DE. Contact holes CNT are formed in the insulating film IF2 and the interlayer insulating film IL1 so as to expose the surfaces of the source electrode SE and the drain electrode DE. In addition, a source wiring SL and a drain wiring DL are formed over the interlayer insulating film IL1 from the inside of the contact hole CNT. Specifically, the source wiring SL is formed so as to be coupled to the source electrode SE, and the drain wiring DL is formed so as to be coupled to the drain electrode DE.

In the power FET according to the related art 1 using the nitride semiconductor material formed as described above, a two-dimensional electron gas DEG is generated near the interface between the channel layer CH and the electron supply layer ES. That is, a well-type potential lower than the Fermi level is generated near the interface between the channel layer CH and the electron supply layer ES by the effects of a conduction band offset based on a difference between the electron affinities of the channel layer CH and the electron supply layer ES and by the effects of piezoelectric polarization and spontaneous polarization existing in the channel layer CH and the electron supply layer ES. As a result, electrons are accumulated in the well-type potential, and thus the two-dimensional electron gas DEG is generated near the interface between the channel layer CH and the electron supply layer ES.

Here, the reason why the trench TR in which the gate electrode GE is buried reaches the channel layer CH extending across the interface between the channel layer CH and the electron supply layer ES, is as follows. For example, when the gate electrode GE is placed over the electron supply layer ES, even in a state where no voltage is applied to the gate electrode GE, the two-dimensional electron gas DEG is generated at the interface between the channel layer CH and the electron supply layer ES immediately below the gate electrode GE. That is, even in a state where no voltage is applied to the gate electrode GE, when a potential difference is generated between the drain wiring DL and the source wiring SL, there is reached a normally-on state where an on-current flows.

That is, when a nitride semiconductor is used for the channel layer CH and the electron supply layer ES, the bottom of the well-type potential is pushed down by the piezoelectric polarization and the spontaneous polarization due to the use of the nitride semiconductor in addition to the well-type potential due to the conduction band offset between the channel layer CH and the electron supply layer ES. As a result, when the gate electrode GE has no trench structure, even if no voltage is applied to the gate electrode GE, the two-dimensional electron gas DEG is generated near the interface between the channel layer CH and the electron supply layer ES. As a result, a normally-on type device is generated.

However, a power control transistor represented by a power FET is required to be a normally-off type device. Therefore, as shown in FIG. 1, there is proposed a power FET having a structure in which the gate electrode GE is buried in the trench TR.

In the case of the power FET including the gate electrode GE having such a trench structure, the interface between the channel layer CH and the electron supply layer ES is obstructed by the gate electrode GE having the trench structure. Therefore, when a voltage applied to the gate electrode GE is lower than or equal to a threshold voltage, the source electrode SE and the drain electrode DE are not conductive with each other by the two-dimensional electron gas DEG.

On the other hand, in the power FET according to the related art 1, when a voltage higher than or equal to a threshold voltage is applied to the gate electrode GE, electrons are collected near the bottom surface of the gate electrode GE by the positive voltage applied to the gate electrode GE, and thus an accumulation region is formed. As a result, when a voltage higher than or equal to the threshold voltage is applied to the gate electrode GE, the source electrode SE and the drain electrode DE are conductive with each other by the two-dimensional electron gas DEG and the accumulation region. As a result, an on-current flows from the drain electrode DE to the source electrode SE. In other words, electrons flow from the source electrode SE to the drain electrode DE. In this way, in the power FET having the configuration shown in FIG. 1, it is possible to realize a normally-off type device. That is, the gate electrode GE having the trench structure is employed in order to realize a normally-off type device.

In this way, in the power FET according to the related art 1, a normally-off type device is realized, but further performance enhancement is desired. For example, there are desired enhancement of the withstand voltage by reducing a leakage current from the channel layer CH via the buffer layer BUF and further increase in the threshold voltage in the power FET.

Specifically, the buffer layer BUF is a layer having many crystal defects. For example, when the buffer layer BUF is formed from a nitride semiconductor layer, nitrogen holes are often formed by losing nitrogen (N). At this time, the nitrogen holes have the same function as that of donors, and thus, when there are many nitrogen holes in the buffer layer BUF, even if conductive impurities are not introduced into the buffer layer BUF, the buffer layer BUF functions as an n-type semiconductor layer by many nitrogen holes. This means that the resistance of the buffer layer BUF lowers even though conductive impurities are not introduced into the buffer layer BUF. Therefore, the leakage current from the channel layer CH via the buffer layer BUF cannot be ignored, and as a result, the withstand voltage between the source electrode SE and the drain electrode DE decreases with the increase in the leakage current.

In addition, even though a normally-off type device is realized in the power FET according to the related art 1, the threshold voltage of the normally-off type device is a value near 0 V. Therefore, an off-leakage current increases. Furthermore, in consideration of replacement between the power FET using a nitride semiconductor material and a power FET using a silicon material, it is desirable that the power FET using a nitride semiconductor material has the same threshold voltage (for example, 1 V or higher) as that of the power FET using a silicon material. That is, if the same threshold voltage as that of the power FET using a silicon material can be realized in the power FET using a nitride semiconductor material, the power FET using a silicon material can be replaced with the power FET using a nitride semiconductor material without changing the design of a control circuit of the power FET, and thus it is considered that the replacement with the power FET using a nitride semiconductor material goes smoothly. From the above, it is known that there is room for improvement from the viewpoint of the enhancement of the withstand voltage and the increase of the threshold voltage in the power FET according to the related art 1.

Figure 2:
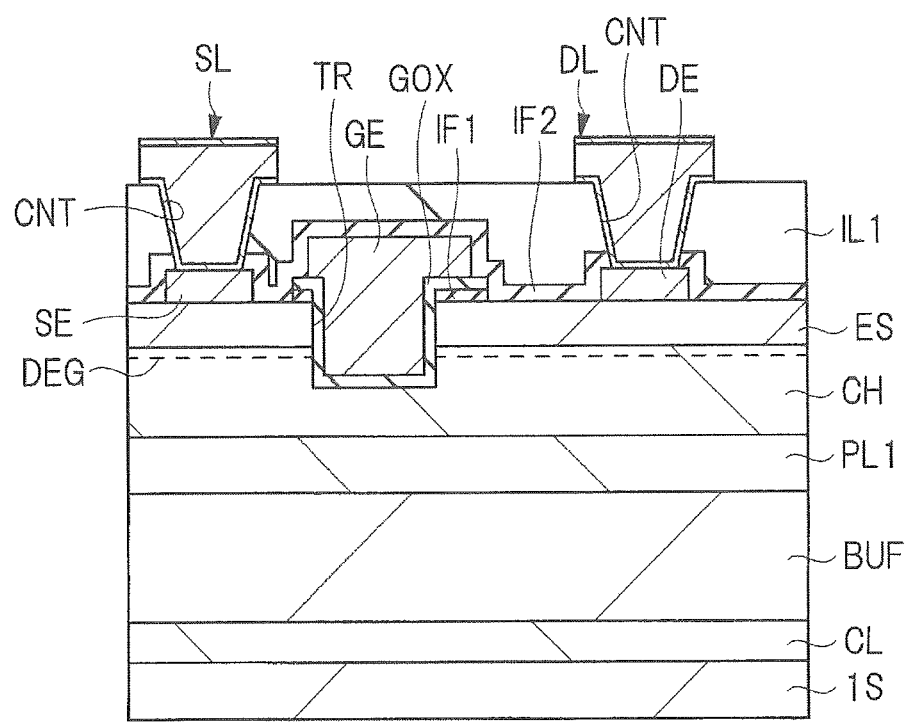
FIG. 2 is a cross-sectional view showing a configuration example of a power FET according to a related art 2.

In regard to this point, for example, there is a related art 2. FIG. 2 is a cross-sectional view showing a configuration example of a power FET according to a related art 2. In FIG. 2, the power FET according to the related art 2 includes a p-type semiconductor layer PL1 provided so as to be sandwiched between the buffer layer BUF and the channel layer CH. According to the related art 2, it is possible to raise the conduction band of the channel layer CH in contact with the p-type semiconductor layer PL1 by providing the p-type semiconductor layer PL1. This means that a positive voltage applied to the gate electrode GE in order to form the accumulation region at the bottom of the gate electrode GE increases. That is, as a result of the fact that the p-type semiconductor layer PL1 is provided under the channel layer CH as in the related art 2, the conduction band of the channel layer CH is raised, and thus the threshold voltage of the power FET can be increased.

Furthermore, in the related art 2, the p-type semiconductor layer PL1 includes a material that causes the band gap of the p-type semiconductor layer PL1 to be sufficiently larger than that of the channel layer CH. Thereby, it is possible to reduce the leakage current via the p-type semiconductor layer PL1 and the buffer layer BUF, and thus it is possible to enhance the withstand voltage between the source electrode SE and the drain electrode DE of the power FET. This is because the fact that the band gap of the p-type semiconductor layer PL1 increases means that the p-type semiconductor layer PL1 becomes close to an insulating body and this means that the leakage current flowing through the p-type semiconductor layer PL1 decreases. From the above, it is possible to enhance the withstand voltage between the source electrode SE and the drain electrode DE and increase the threshold voltage of the power FET by inserting the p-type semiconductor layer PL1 having a large band gap between the buffer layer BUF and the channel layer CH as in the related art 2. That is, according to the related art 2, it is possible to enhance the withstand voltage and increase the threshold voltage as compared with the related art 1, and thus it is possible to enhance the performance of the power FET.

For example, as a p-type semiconductor layer PL1 having a band gap larger than that of the channel layer CH, there is an AlGaN layer in which magnesium (Mg) that is an acceptor, is introduced. However, in the case where a p-type semiconductor layer PL1 includes a nitride semiconductor layer in which acceptors are introduced, the inventors found that there is room for improvement as described below. That is, while the related art 2 shown in FIG. 2 can improve the performance more than the related art 1 shown in FIG. 1, there is further room for improvement in the related art 2. Hereinafter, the room for improvement existing in the related art 2 will be described.

<Room for Improvement Existing in Related Art>

For example, the p-type semiconductor layer PL1 inserted between the buffer layer BUF and the channel layer CH is formed from a nitride semiconductor layer, and acceptors represented by, for example, magnesium (Mg) are introduced into the nitride semiconductor layer.

At this time, actually, it is possible to cause the nitride semiconductor layer to function as the p-type semiconductor layer PL1 not only by adding acceptors to the nitride semiconductor layer, but also by activating the added acceptors through performing, for example, heat treatment after the addition of the acceptors to the nitride semiconductor layer.

However, the nitride semiconductor layer has properties of the low activation rate of the added acceptors due to the basically large band gap when forming the p-type semiconductor layer PL1. This is because, in the nitride semiconductor layer, since the band gap is large, an energy difference between the acceptor level of the acceptors and the upper end of a valence band is large, and as a result, electrons are difficult to be excited from the valence band to the acceptor level. That is, the rate at which electrons existing in the valence band are excited to the acceptor level and the acceptors are ionized (activated), is small in the nitride semiconductor layer. Namely, only after the electrons from the valence band are captured by the acceptors existing at the acceptor level, positive holes are formed in the valence band due to the loss of electrons, and thus it is possible to cause the nitride semiconductor layer to function as the p-type semiconductor layer PL1.

However, in the nitride semiconductor layer, the rate of ionization (activation) caused by electrons supplied to the acceptors from the valence band is low, and thus a part of acceptors introduced into the nitride semiconductor layer are not ionized. In this case, due to the acceptors that are not ionized, there exists an acceptor level in which no electron is captured at a high position from the upper end of the valence band, and the acceptor level forms a so-called deep level. When the number of such deep levels increases, in the power FET, a current variation such as a so-called current collapse or a drift variation is caused. That is, when the p-type semiconductor layer PL1 is formed by the nitride semiconductor layer, the deep levels due to the acceptors that are not activated are formed inside the p-type semiconductor layer PL1 due to the low activation rate of the acceptors. As a result, in the related art 2, a current collapse based on the deep level becomes apparent.

Hereinafter, there will be described a mechanism by which the current collapse is caused on the basis of the deep level. For example, the power FET is generally operated on the basis of a predetermined frequency signal. In this case, an electron is trapped by a deep level formed in the p-type semiconductor layer PL1 or an electron is released from the deep level in accordance with the frequency. That is, an electron is trapped by or released from the deep level in accordance with the frequency. For example, there will be considered a case where an electron is trapped by the deep level. In this case, an electron having a negative charge is trapped by the deep level, and thus the conduction band of the p-type semiconductor layer PL1 is raised. This means that the conduction band of the channel layer CH in contact with the p-type semiconductor layer PL1 is also raised. As a result, the well-type potential existing at the interface between the channel layer CH and the electron supply layer ES is also raised, and thus the amount of the two-dimensional electron gas DEG existing at the interface between the channel layer CH and the electron supply layer ES decreases and the channel including the accumulation region formed at the bottom of the gate electrode GE also becomes narrow. Thereby, the on-resistance of the power FET increases and the on-current decreases.

On the other hand, when an electron is released from the deep level, the conduction band of the p-type semiconductor layer PL1 is lowered. This means that the conduction band of the channel layer CH in contact with the p-type semiconductor layer PL1 is also lowered. As a result, the well-type potential existing at the interface between the channel layer CH and the electron supply layer ES is also lowered, and thus the amount of the two-dimensional electron gas DEG existing at the interface between the channel layer CH and the electron supply layer ES increases and the channel formed by the accumulation region formed at the bottom of the gate electrode GE widens. Thereby, the on-resistance of the power FET decreases and the on-current increases. From the above, when electrons are repeatedly trapped by and released from the deep level depending on the frequency, the on-current of the power FET varies. This phenomenon is the current collapse of the power FET. Therefore, when the number of deep levels due to acceptors that are not activated increases, the variation of the conduction band due to trap and release of electrons at the deep levels becomes noticeable. As a result, the variation of the on-current of the power FET becomes apparent. Namely, when the deep levels are formed by the acceptors that are not activated, the current collapse becomes apparent in the power FET.

Therefore, in the present first embodiment, it is possible to enhance the performance of the power FET by enhancing the withstand voltage and increasing the threshold voltage in the same manner as in the related art 2, and furthermore, measures for suppressing the current collapse that becomes apparent in the related art 2 are taken. That is, in the present first embodiment, while maintaining a basic concept of enhancing the withstand voltage and increasing the threshold voltage by inserting the p-type semiconductor layer PL1 between the buffer layer BUF and the channel layer CH, measures for suppressing as much as possible the generation of deep levels that become apparent when forming the p-type semiconductor layer PL1 from a nitride semiconductor layer are taken. Hereinafter, there will be described a technical idea of the present first embodiment in which the above idea is implemented.

<Configuration of Semiconductor Device According to First Embodiment>

Figure 3:
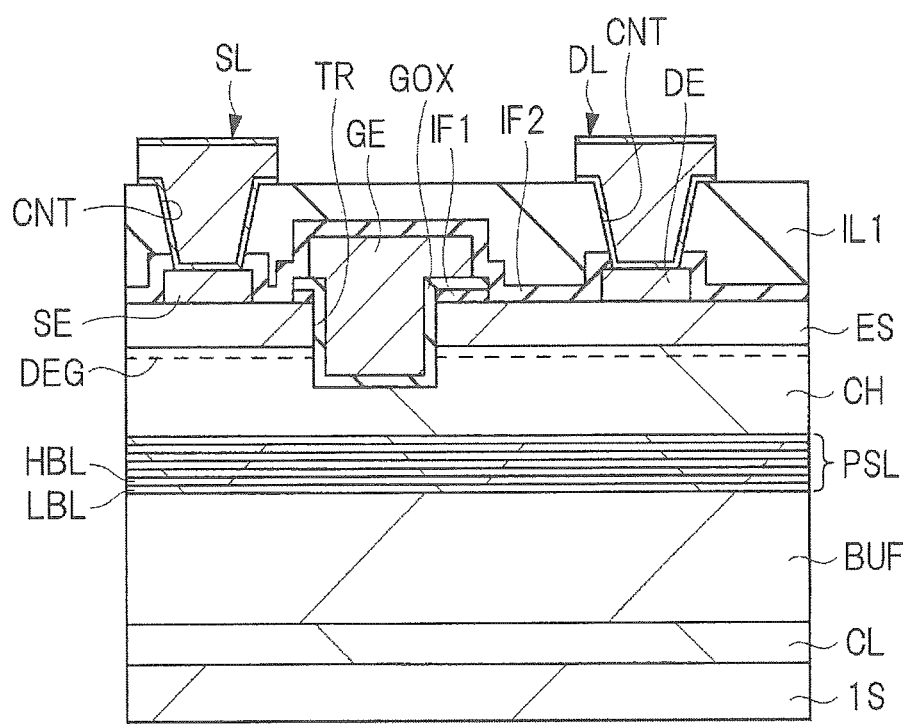
FIG. 3 is a cross-sectional view showing a configuration example of a semiconductor device according to a first embodiment.

FIG. 3 is a cross-sectional view showing a configuration example of a semiconductor device according to the present first embodiment. In the present first embodiment, a power FET (Field Effect Transistor) including a high electron mobility transistor will be described as an example of the semiconductor device.

As shown in FIG. 3, in the power FET of the present first embodiment, a buffer layer BUF including, for example, an $Al_{0.07}Ga_{0.93}N$ layer is formed over a semiconductor substrate 1S including, for example, silicon, via a nucleation layer CL including, for example, an AlN layer (nitride aluminum layer). In addition, a superlattice layer PSL is formed over the buffer layer BUF. The superlattice layer PSL is formed by a laminated structure of a nitride semiconductor layer LBL having a small band gap and a nitride semiconductor layer HBL having a band gap larger than that of the nitride semiconductor layer LBL. Specifically, the nitride semiconductor layer LBL is formed of an InGaN layer and the nitride semiconductor layer HBL is formed of an AlGaN layer.

Furthermore, a high-electron-mobility layer (channel layer) CH including, for example, a GaN layer is formed over the superlattice layer PSL and an electron supply layer ES including, for example, an AlGaN layer is formed over the channel layer CH.

Here, the buffer layer BUF is formed in order to relax mismatch between the lattice spacing of silicon (Si) forming the semiconductor substrate 1S and the lattice spacing of gallium nitride (GaN) forming the channel layer CH. That is, when the channel layer CH including gallium nitride (GaN) is directly formed over the semiconductor substrate 1S including silicon, many crystal defects are formed in the channel layer CH, and thus the performance of the power FET degrades. From the above, the buffer layer BUF aimed at lattice relaxation is inserted between the semiconductor substrate 1S and the channel layer CH. It is possible to enhance the quality of the channel layer CH formed over the buffer layer BUF via the superlattice layer PSL by forming the buffer layer BUF, and thus the performance of the power FET can be enhanced.

Meanwhile, in the present first embodiment, there has been described an example in which silicon (Si) is used as the semiconductor substrate 1S, but the example is not limited to this, and a substrate including silicon carbide (SiC), sapphire ($Al_2O_3$), gallium nitride (GaN), diamond (C), or the like may be used.

Next, as shown in FIG. 3, in the power FET of the present first embodiment, there is formed an insulating film IF1 including, for example, a nitride silicon film on the surface of the electron supply layer ES, and there is formed a trench (groove) TR which reaches the channel layer CH from the surface of the electron supply layer ES, extending across an interface between the electron supply layer ES and the channel layer CH. A gate insulating film GOX including, for example, a silicon oxide film ($SiO_2$ film) and an aluminum oxide film ($Al_2O_3$ film) is formed on the inner wall of the trench TR, and a gate electrode GE is buried inside the trench TR via the gate insulating film GOX.

Further, as shown in FIG. 3, a source electrode SE and a drain electrode DE, which function as ohmic electrodes, are formed over the electron supply layer ES and, for example, an insulating film IF2 including a nitride silicon film and an interlayer insulating film IL1 including a silicon oxide film are formed so as to cover the source electrode SE and the drain electrode DE. Contact holes CNT are formed in the insulating film IF2 and the interlayer insulating film IL1 so as to expose the surfaces of the source electrode SE and the drain electrode DE. A source wiring SL and a drain wiring DL are formed over the interlayer insulating film IL1 from the inside of the contact hole CNT. Specifically, the source wiring SL is formed so as to be electrically coupled to the source electrode SE and the drain wiring DL is formed so as to be electrically coupled to the drain electrode DE.

<Major Characteristics of First Embodiment>

The major characteristics of the present first embodiment are the configuration of the superlattice layer PSL shown in FIG. 3, and thus, first, a detailed configuration of the superlattice layer PSL will be described.

FIG. 4A is a diagram showing a schematic configuration of the superlattice layer PSL, and FIG. 4B is a diagram showing a band gap of each layer forming the superlattice layer PSL. In addition, FIG. 4C is a diagram showing the concentration of acceptors introduced into each layer of the superlattice layer PSL.

As shown in FIG. 4A, it is known that the superlattice layer PSL includes a laminated structure of a nitride semiconductor layer LBL including an InGaN layer and a nitride semiconductor layer HBL including an AlGaN layer. In addition, the channel layer CH is formed over the superlattice layer PSL.

Next, in FIG. 4B, in the nitride semiconductor layer LBL including an InGaN layer, an upper end portion VB1 of the valence band and a lower end portion CB1 of the conduction band are shown and a difference between the lower end portion CB1 of the conduction band and the upper end portion VB1 of the valence band is shown as a band gap BG1. On the other hand, in the nitride semiconductor layer HBL including an AlGaN layer, an upper end portion VB2 of the valence band and a lower end portion CB2 of the conduction band are shown and a difference between the lower end portion CB2 of the conduction band and the upper end portion VB2 of the valence band is shown as a band gap BG2. At this time, it is known that the band gap BG1 is smaller than the band gap BG2. That is, the band gap BG2 is larger than the band gap BG1. Therefore, it is known that the superlattice layer PSL according to the present first embodiment has a structure in which there are alternately laminated the nitride semiconductor layer LBL having the band gap BG1 and the nitride semiconductor layer HBL having the band gap BG2 that is larger than the band gap BG1d.

Next, FIG. 4C shows the concentration D1 of acceptors introduced into the nitride semiconductor layer LBL including an InGaN layer and the concentration D2 of acceptors introduced into the nitride semiconductor layer HBL including an AlGaN layer. At this time, it is known that the concentration D1 of acceptors introduced into the nitride semiconductor layer LBL is higher than the concentration D2 of acceptors introduced into the nitride semiconductor layer HBL. In other words, the concentration D2 of acceptors introduced into the nitride semiconductor layer HBL is lower than the concentration D1 of acceptors introduced into the nitride semiconductor layer LBL.

Here, a first characteristic point of the present first embodiment lies in the fact that the concentration of acceptors introduced into the nitride semiconductor layers LBL forming a part of the superlattice layer PSL is higher than the concentration of acceptors introduced into the nitride semiconductor layers HBL forming the other part of the superlattice layer PSL on the assumption that, for example, the superlattice layer PSL is inserted between the buffer layer BUF and the channel layer CH. That is, in the present first embodiment, the concentration of acceptors introduced into the nitride semiconductor layer LBL having a small band gap is higher than the concentration of acceptors introduced into the nitride semiconductor layer HBL having a large band gap. Specifically, the concentration of magnesium (Mg) introduced into the InGaN layer, which is the nitride semiconductor layer LBL having a small band gap, is higher than the concentration of magnesium (Mg) introduced into the AlGaN layer, which is the nitride semiconductor layer HBL having a large band gap.

Thereby, first, according to the present first embodiment, the superlattice layer PSL, as a whole, serves as a p-type semiconductor layer, and thus it is possible to raise the conduction band of the channel layer CH in contact with the superlattice layer PSL, which is the p-type semiconductor layer. This means that a positive voltage applied to the gate electrode GE in order to form the accumulation region at the bottom of the gate electrode GE increases. That is, in the power FET according to the present first embodiment, as a result of the fact that there is provided, under the channel layer CH, the superlattice layer PSL that is a p-type semiconductor layer, the conduction band of the channel layer CH is raised, and thus it is possible to increase the threshold voltage of the power FET. For example, according to the power FET of the present first embodiment, it is possible to secure a threshold voltage of 1 V or higher. Thereby, in the power FET according to the present first embodiment, it is possible to increase the threshold voltage, and thus the off-leakage current can be decreased.

Here, in the present first embodiment, the superlattice layer PSL that functions as a p-type semiconductor layer is provided, and thus the conduction band of the channel layer CH formed over the superlattice layer PSL is raised. While this means that the threshold voltage for forming the accumulation region at the bottom of the gate electrode GE increases, this means simultaneously that the well-type potential formed at the interface between the channel layer CH and the electron supply layer ES is also raised. This means that the amount of the two-dimensional electron gas existing at the interface between the channel layer CH and the electron supply layer ES decreases. Therefore, in the power FET according to the present first embodiment, it is possible to increase the threshold voltage, but simultaneously, there is concern about the increase in the on-resistance with the decrease in the amount of the two-dimensional electron gas.

In this regard, even when the conduction band is raised in the channel layer CH, if the conduction band can be lowered in the electron supply layer ES, it is possible to secure the well-type potential formed at the interface between the channel layer CH and the electron supply layer ES. From this viewpoint, for example, as the electron supply layer ES is formed of an AlGaN layer, it is possible to lower the conduction layer on the electron supply layer ES side by increasing the ratio of aluminum (Al) in the AlGaN layer. This is because when the ratio of aluminum in the AlGaN layer is high, the piezoelectric polarization becomes large. That is, as a result of the fact that the piezoelectric coefficient of the AlGaN layer becomes large, the slope of the band of the conduction band becomes steep and a positive charge of the piezoelectric polarization is formed, in the AlGaN layer, on the interface side with the channel layer CH. By the conduction band lowering effect by the positive charge, the well-type potential formed at the interface between the channel layer CH and the electron supply layer ES is secured, and thus the amount of the two-dimensional electron gas can be increased.

From the above, in the present first embodiment, the conduction band in the channel layer CH is raised by providing the superlattice layer PSL that functions as a p-type semiconductor layer, and thus it is possible to increase the threshold voltage of the power FET. At this time, there is concern about the increase in the on-resistance based on the decrease of the two-dimensional electron gas, but in the present first embodiment, it is possible to suppress the decrease in the two-dimensional electron gas by increasing the ratio of aluminum in the AlGaN layer that forms the electron supply layer ES, and thus the increase in the on-resistance is suppressed. That is, in the present first embodiment, it is possible to increase the threshold voltage of the power FET while suppressing the decrease in the two-dimensional electron gas.

Furthermore, in the power FET according to the present first embodiment in which a nitride semiconductor material is used, it is possible to realize the same threshold voltage as that of the power FET in which a silicon material is used. From the above, it becomes possible to replace a power FET using a silicon material with the power FET according to the present first embodiment without changing the design of a control circuit of the power FET.

Moreover, according to the present first embodiment, the concentration of acceptors introduced into the nitride semiconductor layer LBL having a small band gap is higher than the concentration of acceptors introduced into the nitride semiconductor layer HBL having a large band gap. Namely, the ratio of the acceptors introduced into the nitride semiconductor layer HBL having a large band gap is small, and thus it is possible to suppress the generation of the deep levels that are easily formed in the nitride semiconductor layer HBL having a large band gap. As a result, according to the present first embodiment, it is possible to suppress occurrence of the current collapse due to the deep levels. That is, in the present first embodiment, the superlattice layer PSL is formed by the laminated structure of the nitride semiconductor layers LBL having a small band gap and the nitride semiconductor layers HBL having a large band gap, and in the superlattice layer PSL, the acceptors are preferentially introduced into the nitride semiconductor layers LBL having a small band gap. At this time, in the nitride semiconductor layer LBL having a small band gap, the activation rate of the acceptors is higher than that in the nitride semiconductor layer HBL having a large band gap. As a result, by preferentially introducing acceptors into the nitride semiconductor layers LBL having a small band gap, it is possible to effectively suppress the generation of the deep levels due to acceptors that are not activated while forming the whole superlattice layer PSL as a p-type semiconductor layer. Therefore, according to the present first embodiment, by having the aforementioned first characteristic point, it is possible to significantly reduce the current collapse due to the generation of the deep levels while realizing a normally-off type power FET having a low threshold voltage. Namely, according to the present first embodiment, it is possible to enhance the performance of the power FET.

Hereinafter, there will be described, with reference to the drawings, a qualitative mechanism in which the activation rate of the acceptors in the nitride semiconductor layer HBL having a large band gap becomes lower than that in the nitride semiconductor layer LBL having a small band gap.

For example, the superlattice layer PSL inserted between the buffer layer BUF and the channel layer CH is formed from the nitride semiconductor layers LBL having a small band gap and the nitride semiconductor layers HBL having a large band gap, and acceptors represented by, for example, magnesium (Mg) are introduced into the nitride semiconductor layers LBL and the nitride semiconductor layers HBL.

At this time, actually, it is possible to cause the nitride semiconductor layers LBL and the nitride semiconductor layers HBL to function as the p-type semiconductor layers not only by addition of acceptors to the nitride semiconductor layers LBL and the nitride semiconductor layers HBL, but also by, for example, performing heat treatment after addition of the acceptors to the nitride semiconductor layers LBL and the nitride semiconductor layers HBL, thereby activate the added acceptors.

Figure 5:
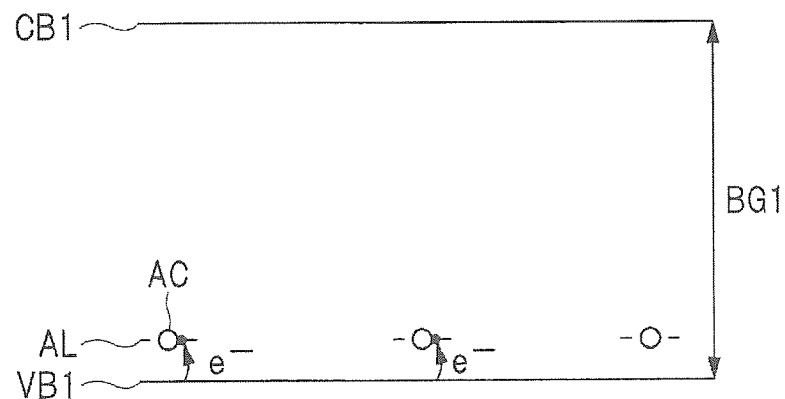
FIG. 5 is a band diagram showing a state in which acceptors introduced into a nitride semiconductor layer having a small band gap are activated.

FIG. 5 is a band diagram showing a state in which acceptors introduced into the nitride semiconductor layer LBL having a small band gap are activated. As shown in FIG. 5, for example, in the nitride semiconductor layer LBL, when forming the p-type semiconductor layer, the activation rate of the added acceptors AC is high because the band gap BG1 is small. This is because in the nitride semiconductor layer LBL, the band gap BG1 is small, and thus an energy difference between the acceptor level AL of the acceptors AC and the upper end portion VB1 of the valence band is small, and as a result, electrons are easily excited from the valence band to the acceptor level AL. That is, the rate, at which electrons existing in the valence band are excited to the acceptor level AL and the acceptors are ionized (activated), is large in the nitride semiconductor layer LBL. Namely, only after the electrons from the valence band are captured by the acceptors AC existing at the acceptor level AL, positive holes are formed in the valence band due to the loss of electrons, and thus it is possible to cause the nitride semiconductor layer LBL to function as the p-type semiconductor layer.

Figure 6:
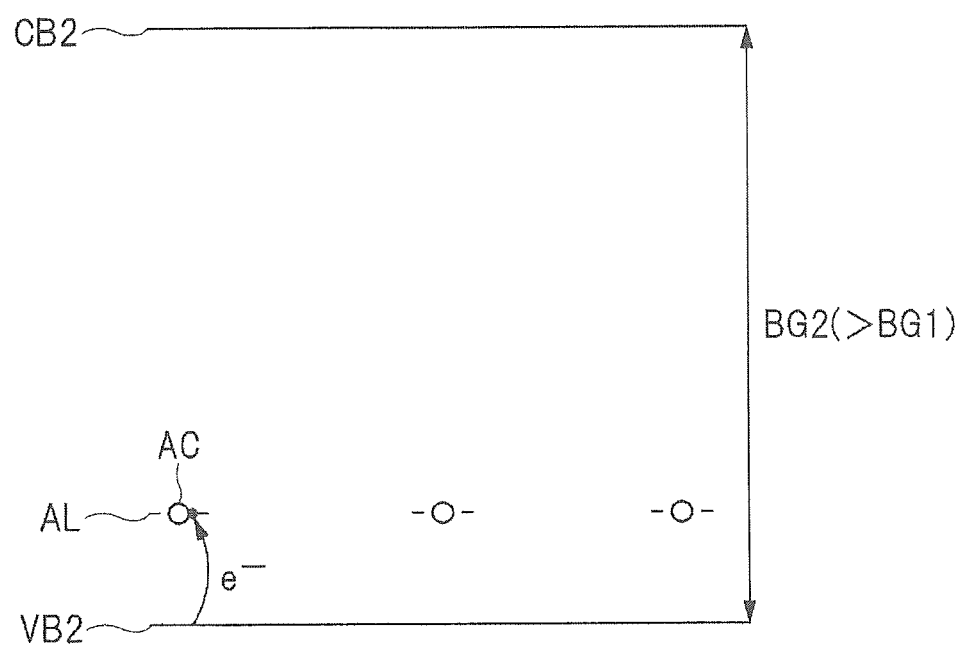
FIG. 6 is a band diagram showing a state in which acceptors introduced into a nitride semiconductor layer having a large band gap are activated.

On the other hand, FIG. 6 is a band diagram showing a state in which acceptors AC introduced into the nitride semiconductor layer HBL having a large band gap are activated. As shown in FIG. 6, for example, in the nitride semiconductor layer HBL, when forming the p-type semiconductor layer, the activation rate of the added acceptors AC becomes low because the band gap BG2 is large. This is because in the nitride semiconductor layer HBL, the band gap BG2 is large, and thus an energy difference between the acceptor level AL of the acceptors AC and the upper end portion VB2 of the valence band is large, and as a result, electrons are difficult to be excited from the valence band to the acceptor level AL. That is, the rate, at which electrons existing in the valence band are excited to the acceptor level AL and the acceptors are ionized (activated), becomes small in the nitride semiconductor layer HBL.

As described above, the activation rate of the acceptors AC introduced into the nitride semiconductor layer LBL having the small band gap BG1 is high. On the other hand, it is known that the activation rate of the acceptors AC introduced into the nitride semiconductor layer HBL having the large band gap BG2 is low.

That is, in the nitride semiconductor layer HBL, the rate of ionization (activation) caused by electrons supplied to the acceptors AC from the valence band is low, and thus a part of the acceptors AC introduced into the nitride semiconductor layer HBL are not ionized. In this case, due to the acceptors AC that are not ionized, there is an acceptor level AL in which no electron is captured at a high position from the upper end portion VB2 of the valence band, and the acceptor level AL forms a so-called deep level. When the number of such deep levels increases in the power FET, there is increased a risk that a current variation such as a so-called current collapse or a drift variation is caused. That is, when the p-type semiconductor layer is formed by the nitride semiconductor layer HBL, the deep levels due to the acceptors AC that are not activated are formed inside the p-type semiconductor layer because the activation rate of the acceptors AC is low.

Therefore, in the present first embodiment, the concentration of the acceptors AC introduced into the nitride semiconductor layer LBL having a small band gap is set to be higher than the concentration of the acceptors AC introduced into the nitride semiconductor layer HBL having a large band gap. That is, according to the present first embodiment, the ratio of the acceptors AC introduced into the nitride semiconductor layer HBL having a large band gap is small, and thus it is possible to suppress the generation of the deep levels that are easily formed in the nitride semiconductor layer HBL having a large band gap. As a result, according to the present first embodiment, it is possible to suppress the occurrence of the current collapse due to the deep levels.

In that situation, there is considered the simple formation of a p-type semiconductor layer including the nitride semiconductor layer LBL having a small band gap without especially forming the superlattice layer PSL including the laminated structure of the nitride semiconductor layers LBL having a small band gap and the nitride semiconductor layers HBL having a large band gap. Also in this case, the p-type semiconductor layer is formed between the buffer layer BUF and the channel layer CH, and thus it is possible to increase the threshold voltage of the power FET. In addition, since acceptors are introduced into the nitride semiconductor layer LBL having a small band gap, it is possible to secure an activation rate of the acceptors, and thus there can be suppressed the generation of deep levels due to acceptors that are not activated. Thereby, it is considered that the suppression of the current collapse due to the deep levels is possible even when the p-type semiconductor layer including the nitride semiconductor layer LBL having a small band gap is simply formed between the buffer layer BUF and the channel layer CH.

In this regard, in the present first embodiment, the superlattice layer PSL formed by a laminated structure of the nitride semiconductor layers LBL having a small band gap and the nitride semiconductor layers HBL having a large band gap is specially formed. On the assumption that the superlattice layer PSL is formed, there exists a reason for setting the concentration of acceptors introduced into the nitride semiconductor layer LBL having a small band gap to be higher than the concentration of acceptors introduced into the nitride semiconductor layer HBL having a large band gap. Hereinafter, the reason will be described.

From the viewpoint of increasing the threshold voltage of the power FET while suppressing the current collapse based on the deep levels, it is definitely considered that the object can be achieved even in a configuration in which the p-type semiconductor layer including the nitride semiconductor layer LBL having a small band gap is simply formed between the buffer layer BUF and the channel layer CH. However, in this configuration, the band gap of the p-type semiconductor layer is still small. Therefore, even if the p-type semiconductor layer is formed between the buffer layer BUF and the channel layer CH, the band gap is smaller than that of the channel layer CH, and thus the leakage current cannot be suppressed. That is, in this configuration, the p-type semiconductor layer does not sufficiently function as a barrier to the leakage current, and thus it is difficult to sufficiently reduce the leakage current, from the channel layer CH, via the p-type semiconductor layer and the buffer layer BUF. Therefore, in the configuration in which the p-type semiconductor layer including the nitride semiconductor layer LBL having a small band gap is simply formed between the buffer layer BUF and the channel layer CH, the leakage current between the source electrode SE and the drain electrode DE via the buffer layer BUF is not sufficiently suppressed, and thus it is difficult to enhance the withstand voltage between the source electrode SE and the drain electrode DE. That is, from the viewpoint of increasing the withstand voltage between the source electrode SE and the drain electrode DE, it cannot be said that the configuration in which the p-type semiconductor layer including the nitride semiconductor layer LBL having a small band gap is simply formed between the buffer layer BUF and the channel layer CH is appropriate.

Therefore, in the present first embodiment, from the viewpoint of simultaneously realizing the increase of the threshold voltage of the power FET while suppressing the current collapse based on the deep levels and the enhancement of the withstand voltage between the source electrode SE and the drain electrode DE, ingenuity is exercised. That is, in the present first embodiment, the superlattice layer PSL is formed from the nitride semiconductor layer LBL having a small band gap and the nitride semiconductor layer HBL having a large band gap and the concentration of the acceptors introduced into the nitride semiconductor layer LBL is set to be higher than the concentration of the acceptors introduced into the nitride semiconductor layer HBL. Thereby, according to the present first embodiment, it is possible to increase the threshold voltage of the power FET and to enhance the withstand voltage between the source electrode SE and the drain electrode DE, while suppressing the current collapse based on the deep levels.

Hereinafter, this will be described. First, according to the present first embodiment, the point that it is possible to increase the threshold voltage of the power FET while suppressing the current collapse based on the deep levels is as described above. On the other hand, according to the present first embodiment, the point that it is possible to enhance the withstand voltage between the source electrode SE and the drain electrode DE can be described as below. In the present first embodiment, the superlattice layer PSL is formed from the nitride semiconductor layer LBL having a small band gap and the nitride semiconductor layer HBL having a large band gap. In this case, the magnitude of the band gap of the entire superlattice layer PSL is an average of the band gap of the nitride semiconductor layer LBL and the band gap of the nitride semiconductor layer HBL. The second characteristic point of the present first embodiment lies in the fact that the average band gap of the superlattice layer PSL is configured to be larger than the band gap of the channel layer CH. Thereby, according to the present first embodiment, the average band gap of the superlattice layer PSL is larger than the band gap of the channel layer CH. This means that the superlattice layer PSL is closer to an insulating body than the channel layer CH. The superlattice layer PSL has a multilayer structure, and thus the superlattice layer PSL has a smaller number of crystal defects represented by nitrogen holes than the buffer layer BUF. Therefore, according to the superlattice layer PSL of the present first embodiment, it is possible to suppress the generation of leakage current flowing through the superlattice layer PSL, by a synergetic effect of the point that the average band gap of the superlattice layer PSL is larger than that of the channel layer CH and the point that the number of crystal defects in the superlattice layer PSL is small. This means that the superlattice layer PSL functions as a barrier to the leakage current and means that it is possible to sufficiently suppress the generation of the leakage current through the buffer layer BUF formed under the superlattice layer PSL. As a result, according to the present first embodiment, it is possible to suppress the generation of the leakage current between the source electrode SE and the drain electrode DE via the buffer layer BUF, and thus is it possible to enhance the withstand voltage between the source electrode SE and the drain electrode DE.

From the above, according to the present first embodiment, due to having the first characteristic point and the second characteristic point described above, it is possible to increase the threshold voltage of the power FET and to enhance the withstand voltage between the source electrode SE and the drain electrode DE, while suppressing the current collapse based on the deep levels.

The technical idea of the present first embodiment is an idea basically focusing on a point where if acceptors are introduced into the nitride semiconductor layer LBL having a small band gap, it is possible to suppress the decrease in the activation rate of the acceptors and form a p-type semiconductor layer while suppressing the generation of the deep levels due to acceptors that are not activated. On the other hand, the technical idea of the present first embodiment is an idea also focusing on a point in which when a p-type semiconductor layer having good crystallinity and having a band gap larger than that of the channel layer CH is formed between the buffer layer BUF and the channel layer CH, it is possible to secure a withstand voltage. That is, in the present first embodiment, measures for successfully implementing two configurations that seemingly conflict with each other are taken. Namely, in the present first embodiment, there is formed the superlattice layer PSL including the laminated structure of the nitride semiconductor layers LBL having a small band gap and the nitride semiconductor layers HBL having a large band gap, and the acceptors are preferentially introduced into the nitride semiconductor layers LBL. Thereby, in the present first embodiment, two configurations that seemingly conflict with each other are successfully implemented. Therefore, the technical idea of the present first embodiment is effective and it is possible to obtain a remarkable effect of increasing the threshold voltage of the power FET and of enhancing the withstand voltage between the source electrode SE and the drain electrode DE, while suppressing the current collapse based on the deep levels.

Meanwhile, in the present first embodiment, for example, on the assumption that the superlattice layer PSL is inserted between the buffer layer BUF and the channel layer CH, the concentration of the acceptors introduced into the nitride semiconductor layers LBL forming a part of the superlattice layer PSL is set to be higher than the concentration of the acceptors introduced into the nitride semiconductor layers HBL forming the other part of the superlattice layer PSL. Thereby, it is possible to increase the threshold voltage of the power FET and to enhance the withstand voltage between the source electrode SE and the drain electrode DE, while suppressing the current collapse based on the deep levels. However, a more desirable form will be described.

When acceptors are introduced into the nitride semiconductor layer HBL having a large band gap, a large number of inactive acceptors are generated because the activation rate of the acceptors is low, and the inactive acceptors generate the deep levels. Therefore, if acceptors are not introduced into the nitride semiconductor layer HBL having a large band gap, it is considered that the generation of the deep levels in the superlattice layer PSL can be further suppressed.

Therefore, a more desirable form of the present first embodiment is a configuration in which among the nitride semiconductor layers LBL and the nitride semiconductor layers HBL which form the superlattice layer PSL, acceptors are introduced into only the nitride semiconductor layers LBL having a small band gap and acceptors are not introduced into the nitride semiconductor layers HBL having a large band gap. By the configuration as described above, it is possible to effectively suppress the generation of the deep levels in the superlattice layer PSL, and thus it is possible to significantly reduce the current collapse due to the deep levels. Also in this desirable form, it is possible to increase the threshold voltage of the power FET and to enhance the withstand voltage between the source electrode SE and the drain electrode DE, while suppressing the current collapse based on the deep levels, and in particular, it is possible to effectively suppress the generation of the deep levels. As a result, it is known that the desirable form of the present first embodiment is an effective technical idea, in particular, from the viewpoint of reducing the current collapse due the deep levels.

<Manufacturing Method of Semiconductor Device According to First Embodiment>

The semiconductor device according to the present first embodiment is configured as described above, and the manufacturing method of the semiconductor device will be described below with reference to the drawings.

Figure 7:
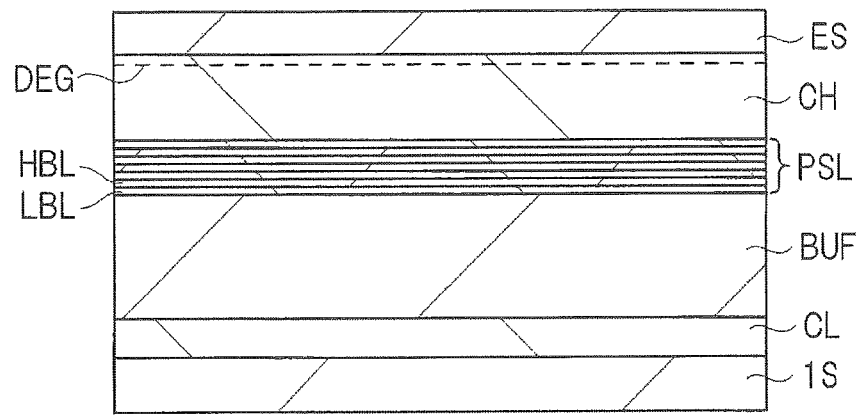
FIG. 7 is a cross-sectional view showing a manufacturing process of the semiconductor device according to the first embodiment.

First, as shown in FIG. 7, for example, a semiconductor substrate 1S including a silicon single crystal is prepared.

Then, a nucleation layer CL including AlN (nitride aluminum) with a thickness of, for example, 200 nm is formed over the semiconductor substrate 1S, and the buffer layer BUF including an $Al_{0.07}Ga_{0.93}N$ layer with a thickness of, for example, 1400 nm is formed over the nucleation layer CL. Thereafter, the superlattice layer PSL with a thickness of, for example, 480 nm is formed over the buffer layer BUF. The superlattice layer PSL is formed so that there are alternately laminated the nitride semiconductor layers LBL including an $In_{0.07}Ga_{0.93}N$ layer with a thickness of 5 nm, to which magnesium (Mg) of $1\times10^{19}$ $cm^{-3}$ is added, and the nitride semiconductor layers HBL including an $Al_{0.35}Ga_{0.65}N$ layer with a thickness of 7 nm. Next, the channel layer CH including a GaN layer with a thickness of, for example, 50 nm is formed over the superlattice layer PSL. Furthermore, an electron supply layer ES including an $Al_{0.22}Ga_{0.78}N$ layer with a thickness of, for example, 30 nm is formed over the channel layer CH. These layers can be formed by using, for example, a MOCVD (Metal Organic Chemical Vapor Deposition) method.

Here, a well-type potential lower than the Fermi level is generated near the interface between the channel layer CH and the electron supply layer ES by the effects of a conduction band offset based on a difference between the electron affinities of the channel layer CH and the electron supply layer ES, and by the effect of piezoelectric polarization and spontaneous polarization existing in the channel layer CH and the electron supply layer ES. As a result, electrons are accumulated in the well-type potential, and thus the two-dimensional electron gas DEG is generated near the interface between the channel layer CH and the electron supply layer ES.

Figure 8:
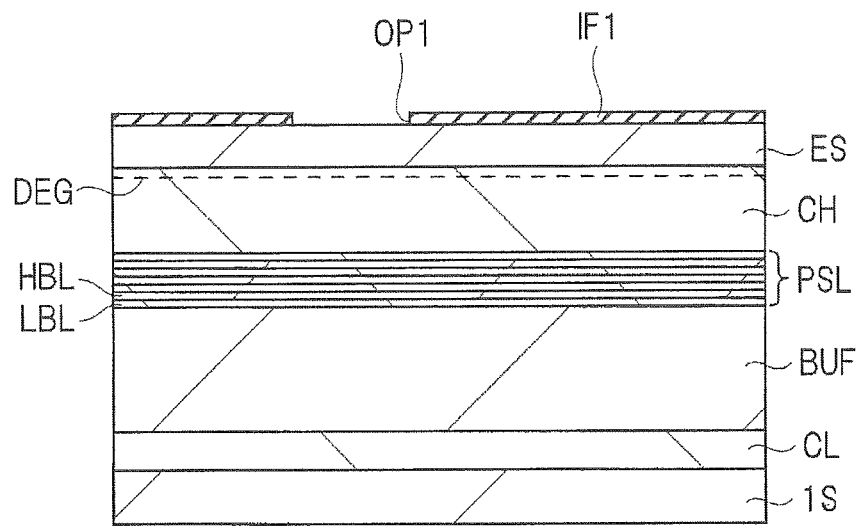
FIG. 8 is a cross-sectional view showing a manufacturing process of the semiconductor device following the process of FIG. 7.

Next, as shown in FIG. 8, the insulating film IF1 is formed over the electron supply layer ES. The insulating film IF1 is formed in order to protect the surface of the electron supply layer ES. The insulating film IF1 is formed of a nitride silicon film with a thickness of, for example, 80 nm and can be formed by using, for example, a PECVD (plasma-enhanced chemical vapor deposition) method. Thereafter, the insulating film IF1 is patterned by using a photolithography technique and an etching technique. The insulating film IF1 is patterned so that an opening OP1 is formed in a gate electrode forming region. At this time, a gas whose main component is $SF_6$ is used for etching the insulating film IF1.

Figure 9:
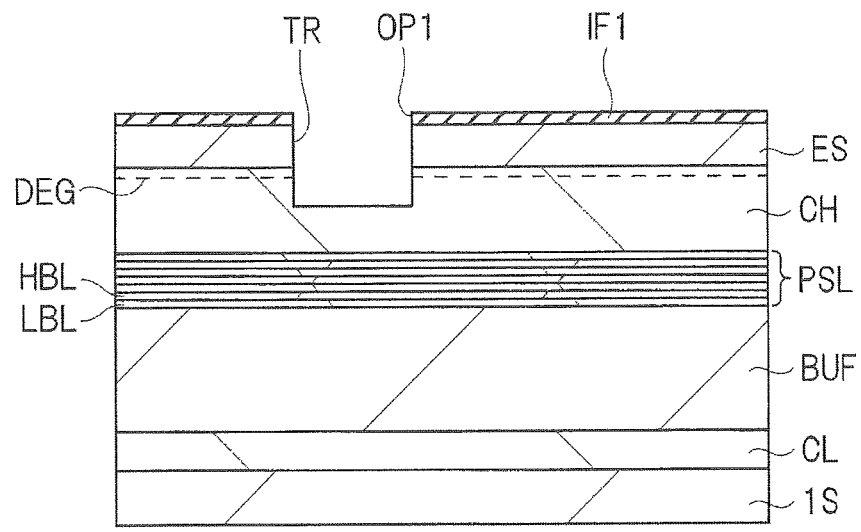
FIG. 9 is a cross-sectional view showing a manufacturing process of the semiconductor device following the process of FIG. 8.

Subsequently, as shown in FIG. 9, the electron supply layer ES exposed from the opening OP1 and a part of the channel layer CH are removed by an etching technique using the patterned insulating film IF1 as a mask. Thereby, the trench TR is formed. An etching gas used at this time is a gas whose main component is, for example, $BCl_3$.

Figure 10:
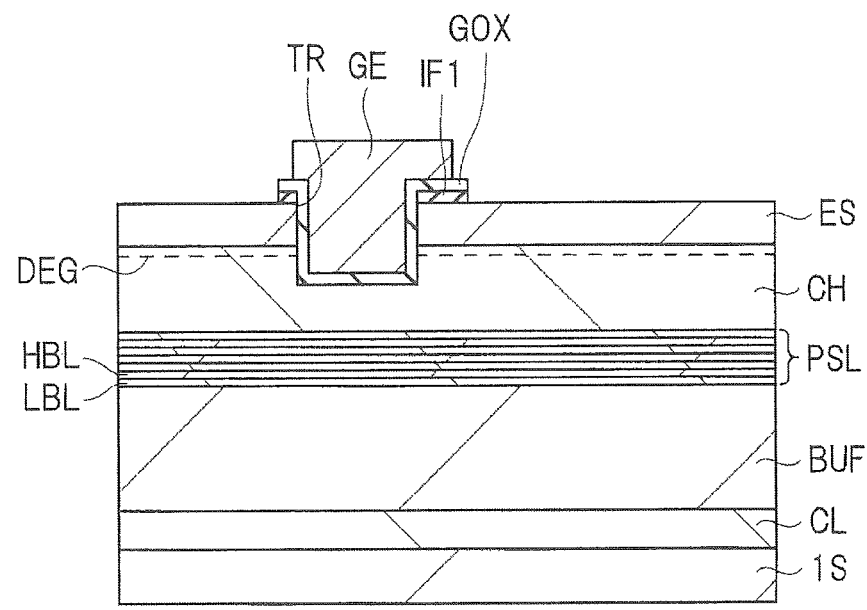
FIG. 10 is a cross-sectional view showing a manufacturing process of the semiconductor device following the process of FIG. 9.

Then, as shown in FIG. 10, the gate insulating film GOX is formed over the insulating film IF1 including the inside of the trench TR. The gate insulating film GOX is formed of an aluminum oxide film ($Al_2O_3$) with a thickness of, for example, 50 nm and can be formed by using, for example, an ALD (Atomic Layer Deposition) method. Thereafter, a titanium nitride (TiN) film with a thickness of 500 nm is formed over the gate insulating film GOX by using, for example, a sputtering method.

Next, the gate electrode GE is formed by patterning the titanium nitride film by using a photolithography technique and an etching technique. Then, the gate insulating film GOX exposed by patterning the titanium nitride film is removed by etching, and furthermore, a part of the insulating film IF1 exposed by etching the gate insulating film GOX is also removed by etching. A gas whose main component is $BCl_3$ is used to etch the gate insulating film GOX and a gas whose main component is $SF_6$ is used for etching the insulating film IF1.

Figure 11:
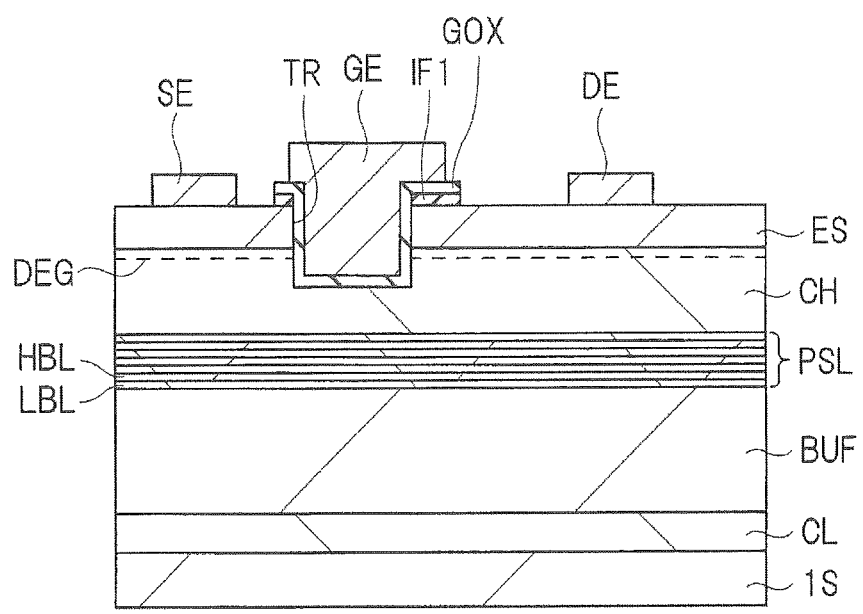
FIG. 11 is a cross-sectional view showing a manufacturing process of the semiconductor device following the process of FIG. 10.

Subsequently, as shown in FIG. 11, an Al layer including aluminum is formed on the entire surface of the semiconductor substrate 1S over which the gate electrode GE is formed. The Al layer has a thickness of, for example, 400 nm and can be formed by using, for example, a sputtering method.

Next, the Al layer is patterned by using a photolithography technique and an etching technique. In the etching technique used at this time, a gas containing a main component of, for example, $Cl_2$ is used. Thereby, it is possible to form ohmic electrodes including an aluminum layer. For example, as shown in FIG. 11, a pair of ohmic electrodes is formed so that the ohmic electrodes sandwich the gate electrode GE but the ohmic electrodes are separated from the gate electrode GE. Specifically, the right ohmic electrode of the pair of ohmic electrodes shown in FIG. 11 functions as the drain electrode DE and the left ohmic electrode functions as the source electrode SE. After the source electrode SE and the drain electrode DE are formed in this way, for example, a heat treatment is performed on the semiconductor substrate 1S. Thereby, it is possible to reduce the contact resistance between the source electrode SE and the electron supply layer ES which is a nitride semiconductor layer. In the same way, it is possible to reduce the contact resistance between the drain electrode DE and the electron supply layer ES which is a nitride semiconductor layer.

Figure 12:
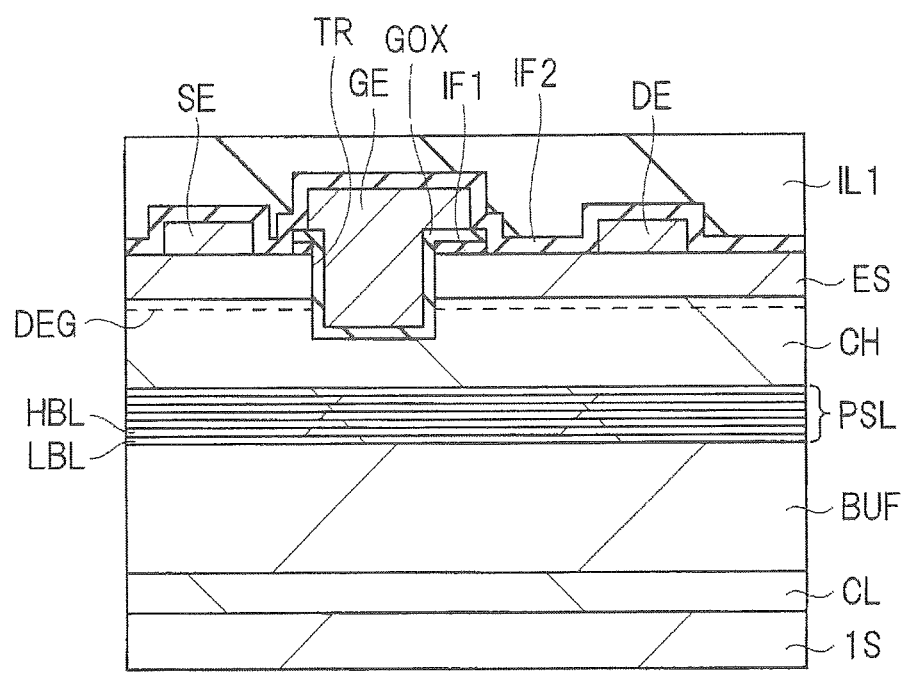
FIG. 12 is a cross-sectional view showing a manufacturing process of the semiconductor device following the process of FIG. 11.

Thereafter, as shown in FIG. 12, the insulating film IF2 is formed over the semiconductor substrate 1S over which the gate electrode GE, the source electrode SE, and the drain electrode DE are formed, and the interlayer insulating film IL1 is formed over the insulating film IF2. The insulating film IF2 is formed of, for example, a nitride silicon film and can be formed by using, for example, a PECVD method. On the other hand, the interlayer insulating film IL1 is formed of, for example, a silicon oxide film and can be formed by using, for example, a PECVD method.

Figure 13:
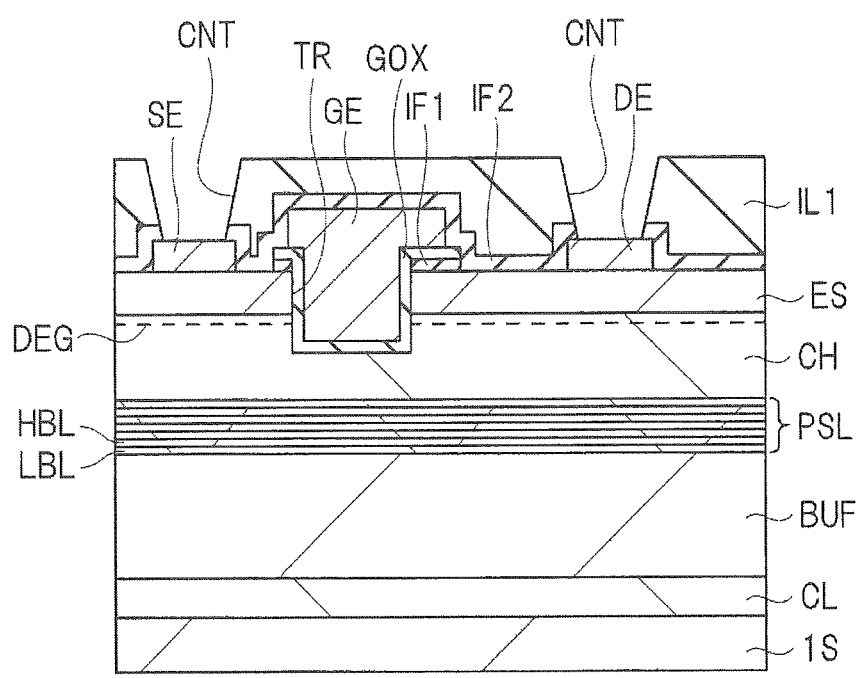
FIG. 13 is a cross-sectional view showing a manufacturing process of the semiconductor device following the process of FIG. 12.

Subsequently, as shown in FIG. 13, contact holes CNT that penetrate the interlayer insulating film IL1 and the insulating film IF2 are formed by using a photolithography technique and an etching technique. At the bottoms of the contact holes, the surfaces of the source electrode SE and the drain electrode DE are exposed. In the etching technique used at this time, a gas containing a main component of, for example, $SF_6$ is used.

Figure 14:
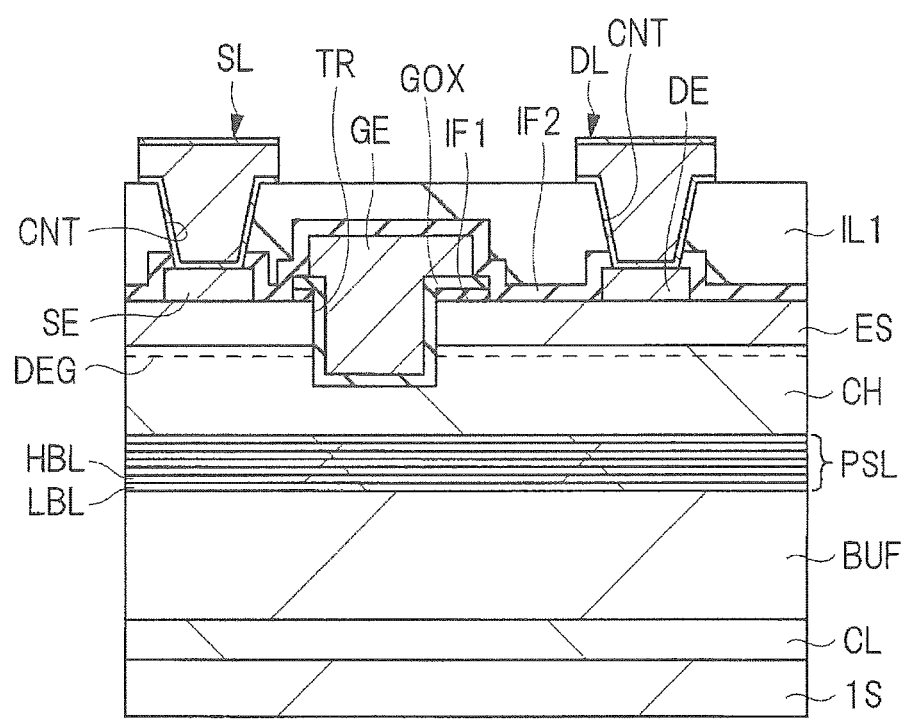
FIG. 14 is a cross-sectional view showing a manufacturing process of the semiconductor device following the process of FIG. 13.

Next, as shown in FIG. 14, a first barrier conductor layer, an AlSiCu layer, and a second barrier conductor layer are sequentially laminated and formed over the interlayer insulating film IL1 including the insides of the contact holes CNT. The first barrier conductor layer and the second barrier conductor layer include, for example, a Ti layer and a TiN layer. These layers can be formed by using, for example, a sputtering method.

Then, the first barrier conductor layer, the AlSiCu layer, and the second barrier conductor layer are patterned by using a photolithography technique and an etching technique. Thereby, it is possible to form wiring layers including the first barrier conductor layer, the AlSiCu layer, and the second barrier conductor layer. Among the wiring layers, a wiring layer electrically coupled to the drain electrode DE is the drain wiring DL and a wiring layer electrically coupled to the source electrode SE is the source wiring SL.

In this way, the semiconductor device according to the present first embodiment can be manufactured. According to the semiconductor device of the present first embodiment, the average band gap of the superlattice layer PSL is larger than the band gap of the channel layer CH, and thus it is possible to reduce the leakage current from the channel layer CH via the superlattice layer PSL and the buffer layer BUF. As a result, in the semiconductor device according to the present first embodiment, it is possible to realize a high withstand voltage. Furthermore, magnesium (Mg) that functions as acceptors is introduced into the nitride semiconductor layer LBL having a small band gap and including an InGaN layer, and thus the entire superlattice layer PSL becomes a p-type semiconductor layer and it is possible to increase the threshold voltage by 1 V or more on the positive potential side. Moreover, magnesium (Mg) is purposely not added to the nitride semiconductor layer HBL having a low activation rate and including an AlGaN layer, and thus deep levels are difficult to be generated and the current collapse can be suppressed.

Meanwhile, in the present first embodiment, for example, an AlN layer (nitride aluminum layer) with a thickness of about 200 nm is used as the nucleation layer CL. However, the material and the thickness can be selected depending on the use and a substrate to be used, and if it is not necessary to use the nucleation layer CL as in the case where the substrate is a GaN substrate, the nucleation layer CL may be omitted.

Moreover, in the present first embodiment, an $Al_{0.07}Ga_{0.93}N$ layer with a thickness of 1400 nm is used as the buffer layer BUF. However, the material and the thickness can be selected depending on the use. For example, the buffer layer BUF may contain a superlattice layer, and furthermore, the entire buffer layer BUF may be a superlattice layer. As the material to be used, there is a material containing a main component of GaN, AlN, InN, or a mixed crystal of these. For example, the material is an AlGaN layer, an InAlN layer, or the like. In the present first embodiment, although addition of conductive impurities is not referred to, appropriate conductive impurities may be added to the buffer layer BUF depending on the use. For example, the donors (n-type impurities) are Si, S, Se, and the like and the acceptors (p-type impurities) are Be, C, Mg, and the like. However, in the present first embodiment, it is assumed that the lattice constant in the in-plane direction of the buffer layer BUF is inherited by an upper layer on the side opposite to the semiconductor substrate 1S, for example, inherited by the channel layer CH and the electron supply layer ES. Therefore, in a region higher than the buffer layer BUF, if a layer having a lattice constant larger than that of the buffer layer BUF, for example, an $In_xGa_{1-x}N$ layer (0≤x≤1) or an AlGaN layer, an InAlN layer, or the like whose composition ratio of aluminum is lower than that of the buffer layer BUF is formed, a compressive strain is applied to the layer. On the other hand, in a region higher than the buffer layer BUF, if a layer whose lattice constant is smaller than that of the buffer layer BUF, for example, an AlGaN layer, an InAlN layer, or the like having a composition ratio of aluminum higher than that of the buffer layer BUF is formed, a tensile strain is applied to the layer. Therefore, it is desirable that the buffer layer BUF has a composition having a lattice constant close to that of the superlattice layer PSL having a thickness larger than the thicknesses of the other upper layers.

In the present first embodiment, the superlattice layer PSL has a structure in which the nitride semiconductor layers LBL including an $In_{0.07}Ga_{0.93}N$ layer with a thickness of 5 nm to which magnesium (Mg) of $1\times10^{19}$ cm$^{-3}$ is added and the nitride semiconductor layers HBL including an $Al_{0.35}Ga_{0.65}N$ layer with a thickness of 7 nm are alternately laminated. However, each of the nitride semiconductor layers LBL and the nitride semiconductor layers HBL that form the superlattice layer PSL can have a desired composition and thickness. In addition, the superlattice layer PSL can also be configured to include two or more types of superlattices.

Meanwhile, each of the nitride semiconductor layers LBL and the nitride semiconductor layers HBL that form the superlattice layer PSL has a lattice constant different from that of the buffer layer BUF, and thus it is necessary that each of these layers has a thickness smaller than or equal to a critical film thickness at which dislocation occurs. Similarly, when the average lattice constant of the superlattice layer PSL is different from the lattice constant of the buffer layer BUF, the total thickness of the superlattice layer PSL is required to be smaller than or equal to the critical film thickness. On the other hand, in consideration of imperfection of crystal, the thickness of each of the nitride semiconductor layers LBL and the nitride semiconductor layers HBL is required to be 2 nm or more to function as a layer. On the other hand, the area density of the acceptors is desired to be $2\times10^{12}$ cm$^{-2}$ or more to cause the superlattice layer PSL to function as a p-type semiconductor layer to sufficiently exert the effect of the present first embodiment represented by the increase of the threshold voltage. Therefore, on the assumption that the activation rate of the magnesium that is the acceptors is 10%, and that the addition amount is the same as that in the present first embodiment, the total thickness of the nitride semiconductor layer LBL including an InGaN layer has to be at least, for example, 20 nm or more, and the total thickness of the superlattice layer PSL is required to be 50 nm or more. In order to form a superlattice layer PSL which has a total thickness of 50 nm or more and in which no dislocation occurs, the average lattice constant of the superlattice layer PSL is desired to be about ±0.005 or less as a degree of mismatch with the lattice constant of the buffer layer BUF.

The average lattice constant of the superlattice layer PSL can be calculated by an approximate calculation method. For example, the superlattice layer PSL is formed by a laminated structure of an $In_{xa}Al_{ya}Ga_{(1-xa-ya)}N$ layer and an $In_{xb}Al_{yb}Ga_{(1-xb-yb)}N$ layer and the film thicknesses of the layers are Ta and Tb, respectively. In this case, the average lattice constant Ls1 (Å) of the superlattice layer PSL can be obtained by $((3.548xa+3.112ya+3.189\ (1-xa-ya))\times Ta+(3.548xb+3.112yb+3.189(1-xb-yb)\times Tb)/(Ta+Tb)$. Here, 3.548, 3.112, and 3.189 are reported values of the lattice constants of InN, AlN, and GaN, respectively. When the lattice constant of the buffer layer BUF is Lbuf (Å), the degree of mismatch can be obtained by (Ls1-Lbuf)/Lbuf.

In the present first embodiment, the composition and the thickness of the superlattice layer PSL are required to be selected so that the average band gap of the superlattice layer PSL is larger than the band gap of the channel layer CH. At this time, in the same manner as the film thickness, the average band gap (eV) of the superlattice layer PSL can be calculated by an approximate calculation method. Specifically, the average band gap of the superlattice layer PSL can be obtained by $((0.7xa+6.12ya+3.42(1-xa-ya))\times Ta+(0.7xb+6.12yb+3.42(1-xb-yb)\times Tb)/(Ta+Tb)$. Here, 0.7, 6.12, and 3.42 are reported values of the band gap of InN, AlN, and GaN, respectively.

In the superlattice layer PSL according to the present first embodiment, an InGaN layer to which magnesium is added is used as the nitride semiconductor layer LBL having a small band gap. However, dopant to be added may be dopant serving as acceptors such as carbon (C) and the addition amount may be a desired value. However, at present, p-type dopant having the highest activation rate is magnesium (Mg), and thus the dopant is desired to be magnesium.

The lattice constants of the nitride semiconductor layers LBL and the nitride semiconductor layers HBL that form the superlattice layer PSL are often different from the lattice constant of the buffer layer BUF. In this case, the film thicknesses of the nitride semiconductor layers LBL and the nitride semiconductor layers HBL are required to be smaller than or equal to a critical film thickness at which no dislocation occurs.

On the other hand, for example, magnesium which is acceptors is added to the InGaN layer that forms the nitride semiconductor layer LBL and the InGaN layer becomes a p-type semiconductor layer. At this time, from the viewpoint of causing the InGaN layer to sufficiently function as a p-type semiconductor layer, it is desirable that the area density of the acceptors is high, and thus it is desirable to increase the film thickness as much as possible within a range of the critical film thickness. However, when the film thickness of the InGaN layer is too thick, there is a risk that a part of the conduction band of the InGaN layer falls below the Fermi level at an interface between the InGaN layer and the AlGaN layer that form the superlattice layer PSL due to the slope of the band based on the piezoelectric polarization and electrons are accumulated. In this case, there is a risk that positive holes caused by the acceptors are offset, and thus the film thickness of the InGaN layer is required to be appropriately adjusted within a range of the critical film thickness.

From the viewpoint of increasing the average band gap of the superlattice layer PSL according to the present first embodiment, it is desirable to increase the composition ratio of aluminum in the AlGaN layer that forms the nitride semiconductor layer HBL. However, when the composition ratio of aluminum in the AlGaN layer is too large, there is a risk that a part of the conduction band of the AlGaN layer falls below the Fermi level and electrons are accumulated, at an interface between the InGaN layer and the AlGaN layer which form the superlattice layer PSL due to the slope of the band based on the piezoelectric polarization. In this case, there is a risk that positive holes caused by the acceptors are offset, and thus the composition ratio of aluminum in the AlGaN layer is required to be appropriately adjusted within a range in which the conduction band of the AlGaN layer does not fall below the Fermi level.

Meanwhile, the uppermost layer of the superlattice layer PSL, which is directly in contact with the channel layer CH, is desired to be not an InGaN layer but an AlGaN layer. This is because there is a probability that electrons are accumulated depending on conditions, at an interface between an InGaN layer and a GaN layer that forms the channel layer CH, due to the polarity of the piezoelectric polarization of the InGaN layer. In contrast to this, when a GaN layer is directly in contact with an AlGaN layer, the polarity of the piezoelectric polarization of the AlGaN layer is opposite to that of an InGaN layer, and thus there is no probability that electrons are accumulated.

In the present first embodiment, a GaN layer with a thickness of 50 nm is used as the channel layer CH, but the material and the thickness can be selected depending on the use. As the material to be used, there is a material whose main component is GaN, AlN, InN, or a mixed crystal of these. In addition, in the present first embodiment, although addition of conductive impurities is not referred to, appropriate conductive impurities may also be added depending on the use. For example, the donors (n-type impurities) are Si, S, Se, and the like and the acceptors (p-type impurities) are Be, C, Mg, and the like. However, electrons travel in the channel layer CH, and thus when a large amount of conductive impurities are added, there is a risk that the mobility of the electrons decreases because of Coulomb scattering. The conductive impurities added to the channel layer CH are desired to be smaller than or equal to $1\times10^{17}$ cm$^{-3}$. Similarly, when the film thickness of the channel layer CH is thin, scattering by the acceptors in the superlattice layer PSL is easily generated, and thus the film thickness of the channel layer CH is desired to be larger than or equal to 20 nm. Furthermore, the channel layer CH includes a material whose electron affinity is larger than that of the superlattice layer PSL and the electron supply layer ES. As in the present first embodiment, when the channel layer CH includes a GaN layer, the lattice constant of the channel layer CH is larger than that of the buffer layer BUF, and thus a compressive strain is applied to the channel layer CH and the thickness of the channel layer CH is required to be smaller than or equal to the critical film thickness at which dislocation occurs.

In the present first embodiment, an $Al_{0.22}Ga_{0.78}N$ layer with a thickness of 30 nm has been used as the electron supply layer ES, but the material and the thickness can be selected depending on the use. Furthermore, the electron supply layer ES may have a laminated structure of multiple layers, such as a multilayer film in which the aluminum composition ratio varies, depending on the purpose. As the material to be used, there is a material whose main component is GaN, AlN, InN, or a mixed crystal of these, and the material is, for example, an AlGaN layer, an InAlN layer, or the like. In the present first embodiment, although addition of conductive impurities is not referred to, appropriate conductive impurities can be added depending on the use. The donors (n-type impurities) are, for example, Si, S, Se, and the like and the acceptors (p-type impurities) are, for example, Be, C, Mg, and the like. In addition, the electron supply layer ES includes a material whose electron affinity is smaller than that of the channel layer CH and whose lattice constant is smaller than that of the buffer layer BUF. That is, a tensile strain is applied to the electron supply layer ES and the thickness of the electron supply layer ES is required to be smaller than or equal to the critical film thickness at which dislocation occurs. However, when the electron supply layer ES has a laminated structure of multiple layers, the electron supply layer ES may include a layer whose electron affinity is larger than that of the channel layer CH and a layer whose lattice constant is larger than that of the buffer layer BUF, but the electron supply layer ES is required to include at least one layer that satisfies the conditions described above.

In the present first embodiment, a nitride silicon film with a thickness of 80 nm has been used as the insulating film IF1, but the material and the thickness can be selected depending on the use, and the insulating film IF1 may have a laminated structure including several types of films. Normally, the insulating film IF1 in contact with a semiconductor is required to have a band gap larger than that of a semiconductor layer of the outermost surface and have an electron affinity smaller than that of the semiconductor layer of the outermost surface, and thus it is desirable that the insulating film IF1 includes a film that satisfies the above condition. The insulating film IF1 can include a large number of insulating films such as a silicon oxide film ($SiO_2$ film), a silicon oxynitride film (SiON film), a SiOC film, an aluminum oxide film ($Al_2O_3$ film), a hafnium oxide film ($HfO_2$ film), a zirconium oxide film ($ZrO_2$ film), and an organic insulating film in addition to the nitride silicon film. However, the insulating film IF1 in an active region is desired to be a film whose interface state density formed at an interface with a semiconductor is low in order to suppress the current collapse.

In the present first embodiment, an aluminum oxide film with a thickness of 50 nm is used as the gate insulating film GOX, but the material and the thickness can be changed depending on the use, and the gate insulating film GOX can be a laminated film including several types of films. The gate insulating film GOX is required to have a band gap larger than that of a semiconductor layer of the outermost surface and to have an electron affinity smaller than that of the semiconductor layer of the outermost surface, and thus it is desirable that a film satisfying the above condition is used as the gate insulating film GOX. Specifically, as candidates of the material of the gate insulating film GOX, there can be included many films such as $SiO_2$, SiON, SiN, $HfO_2$, $ZrO_2$, and the like in addition to $Al_2O_3$. However, the material of the gate insulating film GOX affects a voltage that can be applied to the gate electrode GE and the threshold voltage, and thus it is necessary to design the material of the gate insulating film GOX in consideration of the withstand voltage, the dielectric constant, the film thickness, and the like. In particular, when an electric field is formed in the gate insulating film GOX as in the present first embodiment, the threshold voltage is proportional to the film thickness of the gate insulating film, and thus it is necessary to give extra consideration to the design.

In the present first embodiment, titanium nitride (TiN) with a thickness of 500 nm has been used as the gate electrode GE, but the material and the thickness can be selected depending on the use, and furthermore, the gate electrode GE can have a laminated structure including several types of films. However, it is desirable that the gate electrode GE includes a material that is difficult to react with an insulating film in contact with the gate electrode GE, such as the insulating film IF1 and the gate insulating film GOX. As candidates of the material of the gate electrode GE, there can be included a polysilicon to which a dopant such as boron (B) and phosphorus (P) is added, titanium (Ti), aluminum (Al), nickel (Ni), gold (Au), and a silicon compound and a nitrogen compound of these.

Similarly, in the present first embodiment, aluminum (Al) with a thickness of 400 nm has been used as the source electrode SE and the drain electrode DE, but the source electrode SE and the drain electrode DE may be a material that comes into ohmic contact with a semiconductor layer that is in contact with the source electrode SE and the drain electrode DE. In particular, when the semiconductor layer serves as an n-type semiconductor layer by ion implantation or the like during crystal growth or after crystal growth, most conductors come into ohmic contact with the semiconductor layer, and thus it is possible to use a wide range of materials. However, it is desirable that the source electrode SE and the drain electrode DE are formed of a material that is difficult to react with an insulating film in contact with each electrode. Generally, as candidates of the material of the source electrode SE and the drain electrode DE, there can be included titanium (Ti), aluminum (Al), molybdenum (Mo), niobium (Nb), vanadium (V) and the like, and a mixture, a laminate, a silicon compound, and a nitrogen compound of these.

In the present first embodiment, only the basic configuration and simple wiring layers of the field effect transistor are mainly described, but in an actual semiconductor device, for example, there are cases where further multilayer wiring layers are formed, the description of which is omitted in the present first embodiment.

(Second Embodiment)

In a power FET including a high electron mobility transistor according to the present second embodiment, only the structure of the gate electrode is different from that of the power FET according to the first embodiment. In FIG. 3 showing the power FET according to the first embodiment, the trench TR is formed, and the gate insulating film GOX covering the inner wall of the trench TR and the gate electrode GE in contact with the gate insulating film GOX are formed.

Figure 15:
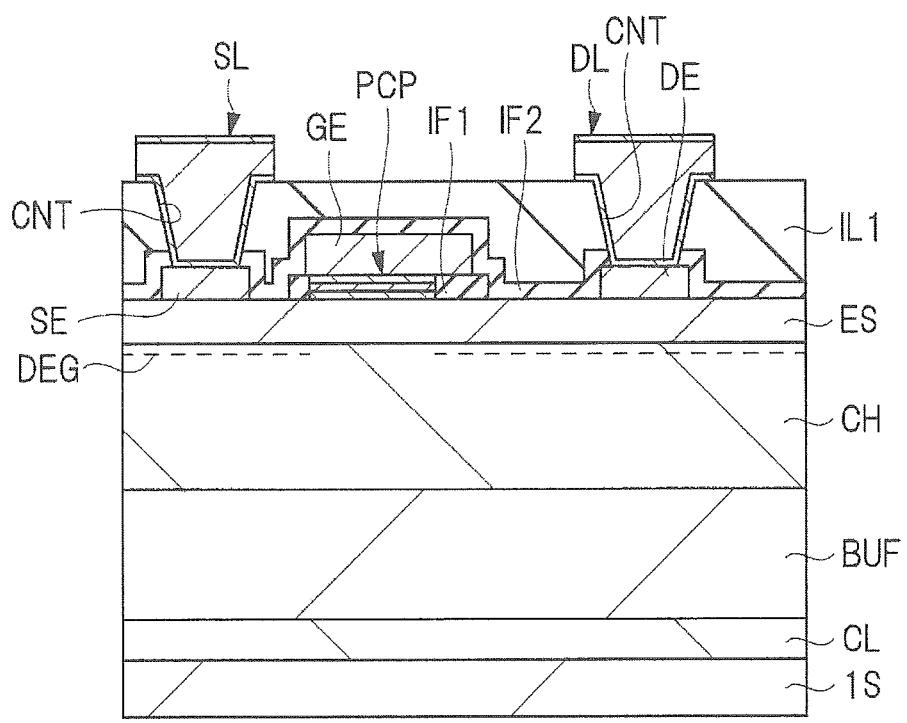
FIG. 15 is a cross-sectional view showing a configuration of a semiconductor device according to a second embodiment.

On the other hand, FIG. 15 is a cross-sectional view showing a configuration of the power FET according to the Present second embodiment. In the present second embodiment, as shown in FIG. 15, a p-type cap layer PCP is formed in contact with the electron supply layer ES and the gate electrode GE is formed over the p-type cap layer PCP. At this time, it is desirable that the p-type cap layer PCP and the gate electrode GE are schottky-coupled to electrons. In addition, a gate insulating film (not shown in the drawings) including an insulating film may be formed between the p-type cap layer PCP and the gate electrode GE. At this time, it is desirable that the p-type cap layer PCP is formed inside the gate electrode GE in plan view. The p-type cap layer PCP can include, for example, a superlattice layer. That is, the superlattice layer described in the first embodiment can be used as the p-type cap layer PCP.

Here, in the power FET shown in FIG. 15, the p-type cap layer PCP is formed under the gate electrode GE, and thus the threshold voltage can be positive, that is, the power FET can be a normally-off type device. For example, when there is not the p-type cap layer PCP and the gate electrode GE is formed directly on the electron supply layer ES, the threshold voltage becomes negative, that is, the power FET becomes a normally-on type device. For example, the power FET used as a power control transistor is required to be a normally-off type device, and thus a structure in which the p-type cap layer PCP is formed under the gate electrode GE is proposed as an example of a normally-off type device.

For example, when a nitride semiconductor is used as the channel layer CH and the electron supply layer ES, the bottom of the well-type potential is pushed down by the piezoelectric polarization and the spontaneous polarization due to using the nitride semiconductor in addition to the well-type potential due to the conduction band offset between the channel layer CH and the electron supply layer ES. As a result, when there is not the p-type cap layer PCP, even if no voltage is applied to the gate electrode GE, the two-dimensional electron gas DEG is generated near the interface between the channel layer CH and the electron supply layer ES. As a result, a normally-on type device is generated.

On the other hand, in the case of FIG. 15 in which the p-type cap layer PCP is formed under the gate electrode GE, the conduction band of the electron supply layer ES is raised by negative charge due to ionization of acceptors in the p-type cap layer PCP. As a result, in a thermal equilibrium state, it is possible to prevent the two-dimensional electron gas from being generated in the channel layer CH. In this way, in the power FET having the configuration shown in FIG. 15, it is possible to realize a normally-off type device. As a result, in addition to the case where the gate electrode has a trench structure as in the power FET according to the first embodiment, in the case where the p-type cap layer PCP is provided immediately under the gate electrode GE as in the power FET according to the present second embodiment, it is possible to realize a normally-off type device.

Also in the present second embodiment, the technical idea according to the first embodiment can be applied to the p-type cap layer PCP. That is, in the present second embodiment, the p-type cap layer PCP can be formed from a superlattice layer. In this case, the concentration of acceptors introduced into a nitride semiconductor layer having a small band gap and forming a part of the superlattice layer is set to be higher than the concentration of acceptors introduced into a nitride semiconductor layer having a large band gap and forming the other part of the superlattice layer. Thereby, in the p-type cap layer PCP, it is possible to increase the activation rate of the acceptors and suppress the generation of deep levels. As a result, according to the present second embodiment, it is possible to form a high quality p-type cap layer PCP.

In particular, according to the present second embodiment, it is possible to increase the activation rate of the acceptors introduced into the p-type cap layer PCP, and thus the conduction band of the electron supply layer ES is efficiently raised by the negative charge due to the ionization of acceptors. As a result, according to the power FET of the present second embodiment, it is possible to obtain an advantage that a normally-off type device is easily realized.

Furthermore, a more desirable form of the present second embodiment is a configuration in which among a plurality of nitride semiconductor layers that form the superlattice layer, acceptors are introduced into only the nitride semiconductor layers having a small band gap and acceptors are not introduced into the nitride semiconductor layers having a large band gap. By the above configuration, it is possible to effectively suppress the generation of deep levels in the superlattice layer.

Figure 16:
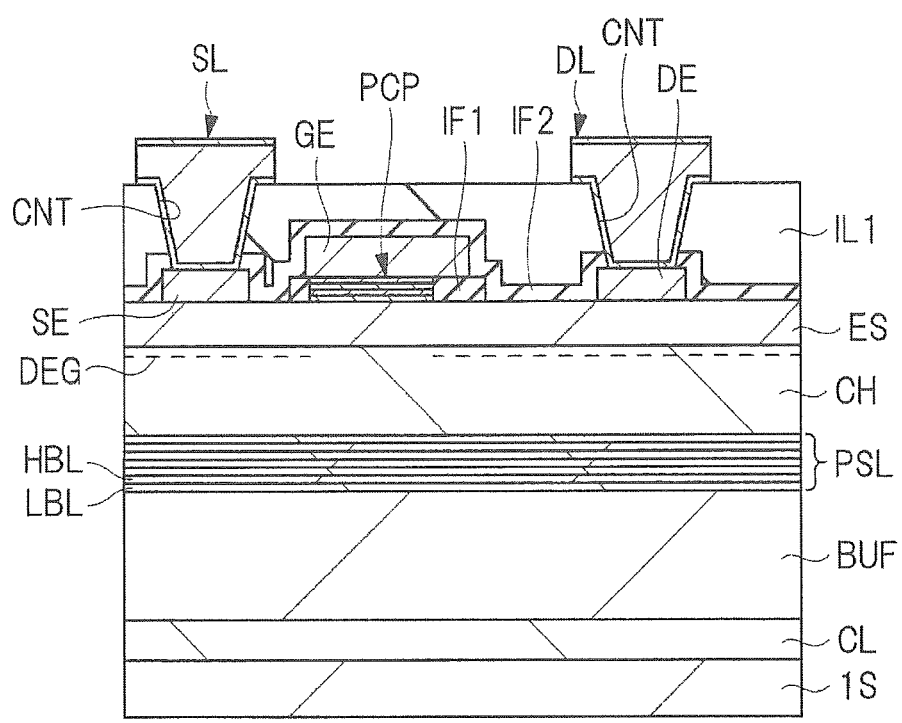
FIG. 16 is a cross-sectional view showing another configuration of the semiconductor device according to the second embodiment.

Also in the power FET according to the present second embodiment, as shown in FIG. 16, on the assumption that the superlattice layer PSL is inserted between the buffer layer BUF and the channel layer CH, it is possible to employ a configuration in which the concentration of acceptors introduced into the nitride semiconductor layers LBL forming a part of the superlattice layer PSL is higher than the concentration of acceptors introduced into the nitride semiconductor layers HBL forming the other part of the superlattice layer PSL. Also in this case, in the same manner as in the first embodiment, it is possible to increase the threshold voltage of the power FET while suppressing the current collapse based on the deep levels and to enhance the withstand voltage between the source electrode SE and the drain electrode DE.

(Third Embodiment)

In the first embodiment and the second embodiment, a power FET including a high electron mobility transistor has been described as an application example of the technical idea, and in the present third embodiment, a semiconductor laser will be described as an application example of the technical idea.

<Configuration of Semiconductor Laser According to Third Embodiment>

For example, a semiconductor laser is used for recording and reproduction of an optical disk. In recent years, a short wavelength semiconductor laser has been often used for recording and reproduction of an optical disk as capacities and densities of optical disks increase. That is, as semiconductor lasers used for recording of an optical disk, the demand for blue-violet semiconductor lasers whose wavelength is shorter than that of red semiconductor lasers is increasing.

A semiconductor laser emits light corresponding to the magnitude of the band gap of the semiconductor material, and thus it is necessary to use a semiconductor material having a large band gap in order to emit blue-violet light whose wavelength is shorter than (energy is larger than) that of red light. Therefore, a nitride semiconductor having a large band gap is used for the blue-violet semiconductor laser.

Figure 17:
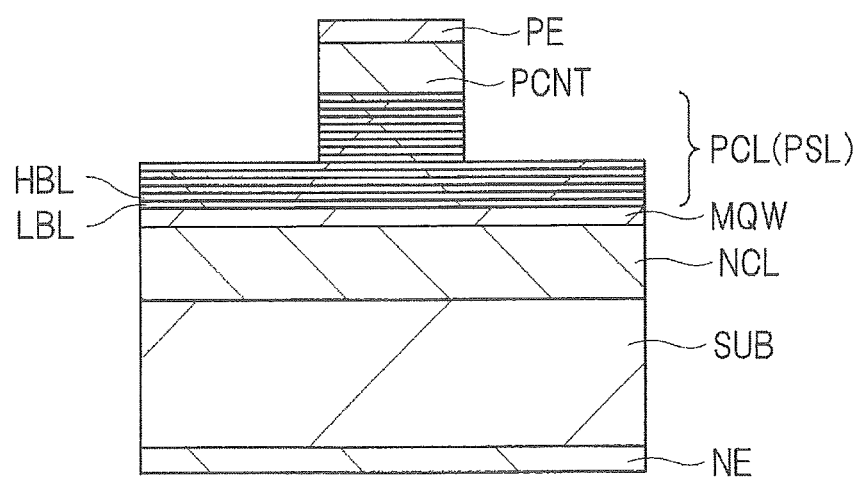
FIG. 17 is a cross-sectional view showing a configuration of a semiconductor laser having a ridge structure.

As a structure of a semiconductor laser using such a nitride semiconductor, there is, for example, a so-called ridge structure. FIG. 17 is a cross-sectional view showing a configuration of a semiconductor laser having the ridge structure. As shown in FIG. 17, an n-electrode NE is formed on the lower surface (rear surface) of the semiconductor substrate SUB, whereas an n-type clad layer NCL is formed on the upper surface (main surface) of the semiconductor substrate SUB. In addition, an active layer MQW including, for example, a multiple quantum well structure is formed over the n-type clad layer NCL and a p-type clad layer PCL is formed over the active layer MQW. In the present third embodiment, the p-type clad layer PCL includes the superlattice layer PSL. In this superlattice layer PSL, the concentration of acceptors introduced into nitride semiconductor layers LBL having a small band gap and which form a part of the superlattice layer PSL is set to be higher than the concentration of acceptors introduced into nitride semiconductor layers HBL having a large band gap and which form the other part of the superlattice layer PSL. An upper portion of the p-type clad layer PCL configured in this way has a mesa structure (ridge structure) and a p-electrode PE is formed over the p-type clad layer PCL, via a p-type contact layer PCNT.

Here, the ridge structure is a structure that controls an optical mode (transverse mode) of light emitted from the active layer MQW so as to be a basic mode (0th order mode) by narrowing the widths of the p-type clad layer PCL and the p-type contact layer PCNT. An advantage of the ridge structure lies in the fact that there can be realized, by one-time continuous crystal growth, the semiconductor layers represented by the n-type clad layer NCL, the active layer MQW, and the p-type clad layer PCL which are formed over the semiconductor substrate SUB. However, in the ridge structure, the widths of the p-type clad layer PCL and the p-type contact layer PCNT are small, and thus the element resistance inevitably becomes large and it can also be said that the ridge structure is a structure in which low voltage operation is difficult.

<Operation of Semiconductor Laser According to Third Embodiment>

The semiconductor laser according to the present third embodiment is configured as described above and the operation of the semiconductor laser will be briefly described below. First, a positive voltage is applied to the p-electrode PE and a negative voltage is applied to the n-electrode NE formed over the rear surface of the semiconductor substrate SUB. Thereby, in the semiconductor laser according to the present third embodiment, a forward current flows from the p-electrode PE to the n-electrode NE. Thereby, positive holes are injected from the p-electrode PE to the active layer MQW, via the ridge structure portion (the p-type contact layer PCNT and the p-type clad layer PCL).

On the other hand, electrons are injected from the n-electrode NE to the semiconductor substrate SUB and the injected electrons are injected to the active layer MQW. In the active layer MQW, a population inversion is formed by the injected positive holes and electrons and electrons move from the conduction band to the valence band by stimulated emission, and thus light having aligned phases is generated. The light generated in the active layer MQW is confined in the active layer MQW by the surrounding semiconductor layers (p-type clad layer. PCL and n-type clad layer NCL) each having a refractive index smaller than that of the active layer MQW. Then, the light confined in the active layer MQW reciprocates in a resonator including cleavage planes formed in the semiconductor laser, and thus the light is amplified by further stimulated emission. Thereafter, laser light oscillates in the active layer MQW and the laser light is emitted from the semiconductor device. At this time, the optical mode (transverse mode) of the laser light oscillating in the active layer MQW becomes the basic mode (0th order mode) because the ridge structure is formed. In this way, the semiconductor laser according to the present third embodiment operates. In particular, in the semiconductor laser according to the present third embodiment, the semiconductor laser is periodically turned on and off by controlling the voltage applied to the p-electrode PE and the voltage applied to the n-electrode NE, and thus it is possible to cause the semiconductor laser according to the present third embodiment to perform a direct modulation operation.

<Advantage of Third Embodiment>

A characteristic point of the present third embodiment lies in the fact that the p-type clad layer PCL includes the superlattice layer PSL and the concentration of acceptors introduced into the nitride semiconductor layer LBL having a small band gap is set to be higher than the concentration of acceptors introduced into the nitride semiconductor layer HBL having a large band gap.

For example, the p-type clad layer PCL confines light in the active layer MQW, and thus the refractive index of the p-type clad layer PCL is lower than that of the active layer MQW. That is, the p-type clad layer PCL includes a material whose refractive index is relatively low. In other words, the p-type clad layer PCL includes a material having a large band gap. Therefore, the p-type clad layer PCL can include an AlGaN layer or the like.

In this way, the p-type clad layer PCL includes a material having a large band gap, but a material having a large band gap has characteristics that the activation rate of acceptors is low, as described in the first embodiment. Therefore, also in the present third embodiment, when the p-type clad layer PCL includes a single semiconductor layer having a large band gap, there are formed a large number of deep levels due to acceptors that are not activated (ionized). In this case, in the semiconductor laser, there is a risk that a current fluctuation occurs on the basis of a large number of deep levels formed in the p-type clad layer PCL. In particular, the semiconductor laser may be configured to perform direct modulation, and in this case, the current flowing in the semiconductor laser periodically varies. At this time, for example, when there area large number of deep levels in the p-type clad layer PCL, electrons are trapped by and released from the deep levels in accordance with the frequency of the current, and thus a current fluctuation occurs due to the trap of the electrons by the deep levels and the release of the electrons from the deep levels. Therefore, there is concern that the current fluctuation significantly affects the direct modulation of the semiconductor laser.

In this regard, in the semiconductor laser according to the present third embodiment, the p-type clad layer PCL includes the superlattice layer PSL and the concentration of acceptors introduced into the nitride semiconductor layer LBL having a small band gap is set to be higher than the concentration of acceptors introduced into the nitride semiconductor layer HBL having a large band gap. Further, preferably, it is configured such that acceptors are introduced into only the nitride semiconductor layer LBL having a small band gap and acceptors are not introduced into the nitride semiconductor layer HBL having a large band gap.

Thereby, according to the present third embodiment, the ratio of the acceptors introduced into the nitride semiconductor layer HBL having a large band gap is small, and thus it is possible to suppress the generation of the deep levels that are easily formed in the nitride semiconductor layer HBL having a large band gap. As a result, according to the present third embodiment, it is possible to suppress occurrence of the current fluctuation due to the deep levels. That is, in the present third embodiment, the superlattice layer PSL is formed by the laminated structure of the nitride semiconductor layers LBL having a small band gap and the nitride semiconductor layers HBL having a large band gap, and in the superlattice layer PSL, the acceptors are preferentially introduced into the nitride semiconductor layers LBL having a small band gap. At this time, in the nitride semiconductor layer LBL having a small band gap, the activation rate of the acceptors becomes higher than that in the nitride semiconductor layer HBL having a large band gap. Therefore, by preferentially introducing acceptors into the nitride semiconductor layers LBL having a small band gap, it is possible to effectively suppress the generation of the deep levels due to acceptors that are not activated while forming the whole superlattice layer PSL as a p-type semiconductor layer.

<Modification>

As a structure of a semiconductor laser using a nitride semiconductor, there is a so-called embedded structure in addition to the ridge structure described above. A configuration of a semiconductor laser having an embedded structure will be described below with reference to a drawing.

<Configuration of Semiconductor Laser According to Modification>

Figure 18:
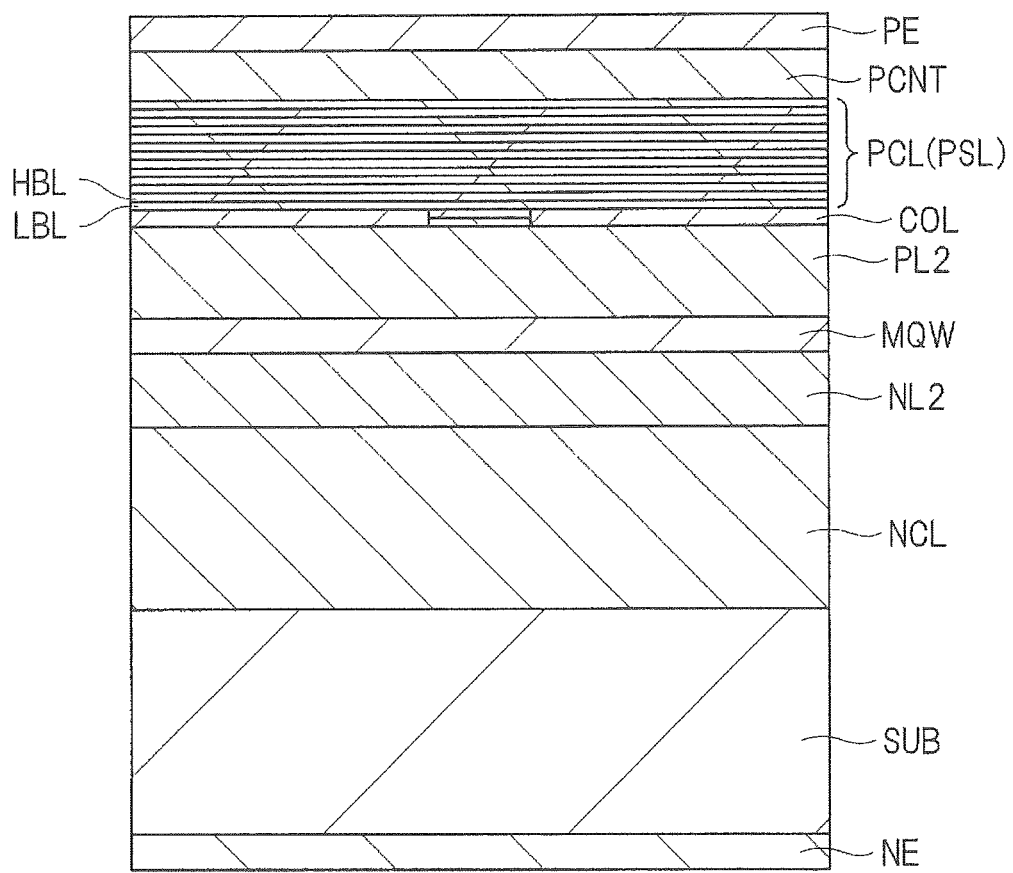
FIG. 18 is a cross-sectional view showing a configuration of a semiconductor laser having an embedded structure.

FIG. 18 is a cross-sectional view showing the configuration of the semiconductor laser having the embedded structure. In FIG. 18, in the semiconductor laser having the embedded structure, an n-electrode NE including Ti (titanium)/Pt (platinum)/Au (gold) is formed under the rear surface (lower surface) of the semiconductor substrate SUB including, for example, n-type GaN (gallium nitride) and an n-type clad layer NCL including, for example, AlGaN (aluminum gallium nitride) into which donors (n-type impurities) are introduced is formed on the surface (upper surface, main surface) of the semiconductor substrate SUB. An n-type light confinement layer NL2 including, for example, GaN into which n-type impurities are introduced is formed over the n-type clad layer NCL and an active layer MQW formed by, for example, a multiple quantum well structure is formed over the n-type light confinement layer NL2. A p-type light confinement layer PL2 including, for example, GaN into which acceptors (p-type impurities) are introduced is formed over the active layer MQW and a current blocking layer (current constricting layer) COL formed by, for example, AlN (nitride aluminum) is formed over the p-type light confinement layer PL2. An opening (an opening extending axially) having a stripe shape is formed in the current blocking layer COL, and a p-type clad layer PCL including, for example, AlGaN into which acceptors (p-type impurities) are introduced is formed over the current blocking layer COL in which the opening is formed. A p-type contact layer PCNT including, for example, GaN into which acceptors (p-type impurities) are introduced is formed over the p-type clad layer PCL, and a p-electrode PE including, for example, Pt/Au/Ti/Pt/Au is formed over the p-type contact layer PCNT.

In the semiconductor laser having the embedded structure formed as described above, the control is performed such that the optical mode (transverse mode) of light emitted from the active layer MQW is the basic mode (0th order mode) by narrowing a path of current flowing from the p-type clad layer PCL to the active layer MQW by the opening provided in the current blocking layer COL. Therefore, it can be said that the semiconductor laser having the embedded structure controls the optical mode (transverse mode) to be the basic mode by a current constriction effect of the current blocking layer COL. Thus, in the embedded structure, it is not necessary to narrow the widths of the p-type clad layer PCL and the p-type contact layer PCNT as performed in the ridge structure described above, and thus it is possible to obtain the p-type clad layer PCL and the p-type contact layer PCNT with sufficiently large widths as compared with the ridge structure. That is, in the semiconductor laser having the embedded structure, the transverse mode is not controlled by the widths of the p-type clad layer PCL and the p-type contact layer PCNT, but the control is performed such that the transverse mode is the basic mode by the width of the opening provided in the current blocking layer COL. Therefore, in the semiconductor laser having the embedded structure, it is possible to increase the widths of the p-type clad layer PCL, the p-type contact layer PCNT, and the p-electrode PE.

In particular, in a semiconductor laser using a nitride semiconductor, bulk resistors represented by the p-type contact layer PCNT and the p-type clad layer PCL make most of the element resistance. Therefore, in the semiconductor laser having the embedded structure in which the widths of the p-type contact layer PCNT and the p-type clad layer PCL can be increased, it is possible to reduce the element resistance as compared with the ridge structure. As a result, the semiconductor laser having the embedded structure has an advantage of being able to operate at a low voltage.

<Advantage of Modification>

Also in the semiconductor laser according to the modification, the p-type clad layer PCL includes the superlattice layer PSL and the concentration of acceptors introduced into the nitride semiconductor layer LBL having a small band gap is set to be higher than the concentration of acceptors introduced into the nitride semiconductor layer HBL having a large band gap. Furthermore, preferably, it is configured such that acceptors are introduced into only the nitride semiconductor layer LBL having a small band gap and acceptors are not introduced into the nitride semiconductor layer HBL having a large band gap.

Thereby, also in the present modification, the ratio of the acceptors introduced into the nitride semiconductor layer HBL having a large band gap is small, and thus it is possible to suppress the generation of the deep levels that are easily formed in the nitride semiconductor layer HBL having a large band gap. As a result, according to the present modification, it is possible to suppress occurrence of the current fluctuation due to the deep levels. That is, in the present modification, the superlattice layer PSL is formed by the laminated structure of the nitride semiconductor layers LBL having a small band gap and the nitride semiconductor layers HBL having a large band gap and the acceptors are preferentially introduced into the nitride semiconductor layers LBL having a small band gap in the superlattice layer PSL. At this time, in the nitride semiconductor layer LBL having a small band gap, the activation rate of the acceptors is higher than that in the nitride semiconductor layer HBL having a large band gap. Therefore, by preferentially introducing acceptors into the nitride semiconductor layers LBL having a small band gap, it is possible to effectively suppress the generation of the deep levels due to acceptors that are not activated while forming the whole superlattice layer PSL as a p-type semiconductor layer.

While the invention made by the inventors has been specifically described based on the embodiments, the invention is not limited to the embodiments, but needless to say that the invention may be modified in various ways without departing from the scope of the invention.

What is claimed is:

1. A semiconductor device comprising:
   a superlattice layer including a laminated structure of a first nitride semiconductor layer and a second nitride semiconductor layer having a band gap larger than that of the first nitride semiconductor layer;
   a channel layer formed on a surface of the superlattice layer and including a nitride semiconductor layer; and
   a gate electrode formed in a trench in the channel layer, wherein the first nitride semiconductor layer includes an InGaN layer comprising p-type impurities, and the second nitride semiconductor layer includes an AlGaN layer, a concentration of p-type impurities introduced into the InGaN layer being greater than a concentration of p-type impurities introduced into the AlGaN layer.

2. The semiconductor device according to claim 1, wherein conductive impurities are introduced into only the first nitride semiconductor layer and conductive impurities are not introduced into the second nitride semiconductor layer, in the superlattice layer.

3. The semiconductor device according to claim 1, wherein the p-type impurities comprise magnesium.

4. The semiconductor device according to claim 1, further comprising:
   a semiconductor element, comprising:
   a semiconductor substrate;
   the channel layer which is formed over the semiconductor substrate;
   an electron supply layer which is formed over the channel layer and includes a nitride semiconductor layer; and
   the superlattice layer formed between the semiconductor substrate and the channel layer.

5. The semiconductor device according to claim 4, wherein an average band gap of the superlattice layer is larger than a band gap of the channel layer.

6. The semiconductor device according to claim 4, wherein a buffer layer that relaxes lattice mismatch between the semiconductor substrate and the superlattice layer is formed.

7. The semiconductor device according to claim 6, wherein a lattice constant of the first nitride semiconductor layer and a lattice constant of the buffer layer are different from each other, and
   wherein a lattice constant of the second nitride semiconductor layer and the lattice constant of the buffer layer are different from each other.

8. The semiconductor device according to claim 7, wherein a thickness of the first nitride semiconductor layer is smaller than a critical film thickness at which dislocation occurs, and
   wherein a thickness of the second nitride semiconductor layer is smaller than a critical film thickness at which dislocation occurs.

9. The semiconductor device according to claim 6, wherein an average lattice constant of the superlattice layer and the lattice constant of the buffer layer are different from each other.

10. The semiconductor device according to claim 9, wherein a total thickness of the superlattice layer is smaller than a critical film thickness at which dislocation occurs.

11. The semiconductor device according to claim 4, wherein an electron affinity of the electron supply layer is smaller than an electron affinity of the channel layer.

12. The semiconductor device according to claim 11, wherein the semiconductor element is a high electron mobility transistor.

13. The semiconductor device according to claim 12, wherein the semiconductor element is a normally-off type high electron mobility transistor.

14. The semiconductor device according to claim 1, further comprising:
a semiconductor element, comprising:
semiconductor substrate;
a channel layer which is formed over the semiconductor substrate and includes a nitride semiconductor layer;
an electron supply layer which is formed over the channel layer and includes a nitride semiconductor layer; and
a p-type cap layer formed over the electron supply layer,
wherein the p-type cap layer includes the superlattice layer.

15. The semiconductor device according to claim 1, further comprising:
a semiconductor element, comprising:
an active layer that functions as a light-emitting layer;
a p-type clad layer whose refractive index is smaller than that of the active layer; and
an n-type clad layer whose refractive index is smaller than that of the active layer;
wherein the active layer is sandwiched by the p-type clad layer and the n-type clad layer, and
wherein the p-type clad layer includes the superlattice layer.

16. The semiconductor device according to claim 1, wherein the channel layer comprise a GaN layer, the first nitride semiconductor layer comprises an InGaN layer, the second nitride semiconductor layer includes an AlGaN layer, and
wherein the channel layer is formed on a surface of the second nitride semiconductor layer.

17. The semiconductor device according to claim 16, further comprising:
an electron supply layer including an AlGaN layer and formed on a surface of the channel layer, the trench being formed in the channel layer and the electron supply layer such that the trench extends across an interface between the electron supply layer and the channel layer.

18. A semiconductor device comprising:
a semiconductor substrate;
a buffer layer including an AlGaN layer and formed on the semiconductor substrate;
a superlattice layer formed on a surface of the buffer layer and including a laminated structure comprising:
a first nitride semiconductor layer including an InGaN layer comprising p-type impurities; and
a second nitride semiconductor layer including an AlGaN layer, a band gap of the second nitride semiconductor layer being greater than a band gap of the first nitride semiconductor layer, and a concentration of p-type impurities introduced into the InGaN layer being greater than a concentration of p-type impurities introduced into the AlGaN layer;
a channel layer including a GaN layer and formed on a surface of the second nitride semiconductor layer;
an electron supply layer including an AlGaN layer and formed on a surface of the channel layer; and
a gate electrode formed in a trench in the channel layer and the electron supply layer such that the trench extends across an interface between the electron supply layer and the channel layer.

* * * * *